US011183543B2

(12) United States Patent
Bang et al.

(10) Patent No.: US 11,183,543 B2
(45) Date of Patent: *Nov. 23, 2021

(54) DISPLAY DEVICE

(71) Applicant: Samsung Display Co., LTD., Yongin-si (KR)

(72) Inventors: Ki Ho Bang, Hwaseong-si (KR); Eunhye Kim, Namyangju-si (KR); Saebom Ahn, Hwaseong-si (KR); Sang Hyun Jun, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/854,898

(22) Filed: Apr. 22, 2020

(65) Prior Publication Data

US 2021/0083013 A1    Mar. 18, 2021

(30) Foreign Application Priority Data

Sep. 16, 2019  (KR) .......................... 10-2019-0113610

(51) Int. Cl.
*H01L 27/32* (2006.01)
*H01L 51/52* (2006.01)
*G06F 3/044* (2006.01)
*G06F 3/041* (2006.01)

(52) U.S. Cl.
CPC .......... *H01L 27/323* (2013.01); *G06F 3/0412* (2013.01); *G06F 3/0445* (2019.05); *H01L 27/3272* (2013.01); *H01L 27/3276* (2013.01); *H01L 51/5237* (2013.01); *G06F 2203/04107* (2013.01); *H01L 2251/301* (2013.01)

(58) Field of Classification Search
CPC ... G06F 3/0412; G06F 3/0445; H01L 27/323; H01L 27/3276; H01L 51/5237
See application file for complete search history.

(56) References Cited

U.S. PATENT DOCUMENTS

| 10,879,319 | B2* | 12/2020 | Bang | ..................... H01L 27/326 |
| 2019/0148469 | A1* | 5/2019 | Lhee | ................... H01L 51/5253 |
| | | | | 257/40 |
| 2019/0237533 | A1* | 8/2019 | Kim | ..................... G06F 3/04164 |
| 2019/0369787 | A1* | 12/2019 | Park | ......................... G06F 3/044 |
| 2020/0027929 | A1* | 1/2020 | Lee | ........................ G06F 3/0446 |
| 2020/0091252 | A1 | 3/2020 | Bang et al. | |

* cited by examiner

*Primary Examiner* — Kent W Chang
*Assistant Examiner* — Scott D Au
(74) *Attorney, Agent, or Firm* — Cantor Colburn LLP

(57) ABSTRACT

A display device includes a base layer including a display area and first and second non-display areas, a circuit device layer on the base layer and including a driving circuit unit overlapping the first and second non-display areas, a power electrode outside the driving circuit unit, and a shielding electrode connected to the power electrode and through which first through-holes are defined, a light emitting device layer on the circuit device layer and including a second electrode and a connection electrode electrically connecting the power electrode to the second electrode and through which second through-holes are defined, a thin film encapsulation layer on the light emitting device layer, and a touch sensing layer on the thin film encapsulation layer. The first and second through-holes do not overlap each other in the first non-display area, and the first and second through-holes overlap each other in the second non-display area.

20 Claims, 13 Drawing Sheets

DISPLAY DEVICE

This application claims priority to Korean Patent Application No. 10-2019-0113610, filed on Sep. 16, 2019, and all the benefits accruing therefrom under 35 USC § 119, the content of which in its entirety is herein incorporated by reference.

BACKGROUND

1. Field

Embodiments relate to a display device. More particularly, embodiments relate to a display device including a touch sensing layer.

2. Description of the Related Art

Various display devices, which are used for a multimedia device such as a television, a mobile phone, a tablet computer, a navigation system, and a game machine, have been developed. A keyboard, a mouse and the like have been widely used as an input device for the display device. Recently, the display device may include a touch sensing unit as an input device.

SUMMARY

Embodiments provide a display device with improved touch sensitivity of a touch sensing layer, in which a light emitting device thereof is effectively prevented from being deteriorated.

According to an embodiment of the invention, a display device includes a base layer including a display area, a first non-display area, and a second non-display area between the display area and the first non-display area, a circuit device layer disposed on the base layer, where the circuit device layer includes a driving circuit unit overlapping the first non-display area and the second non-display area, a power electrode disposed outside the driving circuit unit, and a shielding electrode connected to the power electrode and overlapping the driving circuit unit, where a plurality of first through-holes is defined through the shielding electrode, a light emitting device layer disposed on the circuit device layer, where the light emitting device layer includes a light emitting device overlapping the display area and including a first electrode, a light emitting layer and a second electrode, and a connection electrode electrically connecting the power electrode to the second electrode, where a plurality of second through-holes is defined through the connection electrode, a thin film encapsulation layer disposed on the light emitting device layer, and a touch sensing layer disposed on the thin film encapsulation layer, where the touch sensing layer includes a plurality of touch sensing electrodes and a plurality of touch signal lines connected to the touch sensing electrodes and overlapping the connection electrode. In such an embodiment, the first through-holes and the second through-holes do not overlap each other in the first non-display area, and the first through-holes and the second through-holes overlap each other in the second non-display area.

In an embodiment, the second electrode may cover the second through-holes in the second non-display area.

In an embodiment, the second electrode may overlap the second non-display area and does not overlap the first non-display area.

In an embodiment, the second electrode may overlap the first non-display area and the second non-display area.

In an embodiment, each of the touch signal lines may overlap at least one selected from the shielding electrode and the connection electrode in the first non-display area.

In an embodiment, each of the touch signal lines may overlap at least one selected from the connection electrode and the second electrode in the second non-display area.

In an embodiment, the circuit device layer may further include a first planarization layer disposed between the driving circuit unit and the shielding electrode and a second planarization layer disposed between the shielding electrode and the connection electrode.

In an embodiment, the first through-holes may expose the first planarization layer, and the second through-holes may expose the second planarization layer.

In an embodiment, a valley positioned between the first non-display area and the second non-display area may be defined in the first planarization layer and the second planarization layer.

In an embodiment, the shielding electrode may not overlap the valley.

In an embodiment, the second through-holes of the connection electrode may not overlap the valley.

In an embodiment, the circuit device layer may further include a pixel circuit unit disposed on the base layer and overlapping the display area and a pixel connection electrode disposed between the first planarization layer and the second planarization layer, where the pixel connection electrode is electrically connected to the pixel circuit unit through a first contact hole defined through the first planarization layer, and electrically connected to the first electrode through a second contact hole defined through the second planarization layer.

In an embodiment, the shielding electrode may include a same material as the pixel connection electrode, and the connection electrode may include a same material as the first electrode.

In an embodiment, the first through-holes and the second through-holes may be alternately arranged in a first direction in the first non-display area when viewed in a plan view.

In an embodiment, the first through-holes and the second through-holes may be alternately arranged in a second direction intersecting the first direction in the first non-display area when viewed in the plan view.

In an embodiment, the first through-holes and the second through-holes may define a plurality of rows arranged in a first direction on a plane, the first through-holes in odd rows among the rows and the first through-holes in even rows among the rows may be alternately arranged with each other in a second direction intersecting the first direction in the second non-display area, and the second through-holes in the odd rows among the rows and the second through-holes in the even rows among the rows may be alternately arranged with each other in the second direction.

In an embodiment, the thin film encapsulation layer may include a first inorganic layer disposed on the second electrode, an organic layer disposed on the first inorganic layer and having a flat top surface, and a second inorganic layer disposed on the organic layer and having an end coming into contact with the first inorganic layer.

According to an embodiment of the invention, a display device includes a base layer including a display area, a first non-display area, and a second non-display area between the display area and the first non-display area, a circuit device layer disposed on the base layer, where the circuit device layer includes a driving circuit unit overlapping the first non-display area and the second non-display area, a power electrode disposed outside the driving circuit unit, and a shielding electrode connected to the power electrode, overlapping the first non-display area and not overlapping the second non-display area, where a plurality of first through-holes is defined through the shielding electrode, a light emitting device layer disposed on the circuit device layer, where the light emitting device layer includes a light emitting device including a first electrode, a light emitting layer, and a second electrode, which overlaps at least the second non-display area, and a connection electrode electrically connecting the power electrode to the second electrode, wherein a plurality of second through-holes is defined through the connection electrode, a thin film encapsulation layer disposed on the light emitting device layer, and a touch sensing layer disposed on the thin film encapsulation layer, wherein the touch sensing layer includes a plurality of touch sensing electrodes and a plurality of touch signal lines connected to the touch sensing electrodes and overlapping the connection electrode. In such an embodiment, the first through-holes and the second through-holes do not overlap each other in the first non-display area, and the second electrode covers the second through-holes in the second non-display area.

In an embodiment, the second electrode may non overlap the shielding electrode.

In an embodiment, the second electrode may partially overlap the shielding electrode.

In embodiments of the display device according to the invention, the first through-holes of the shielding electrode may not overlap the second through-holes of the connection electrode in the first non-display area far from the display area, such that noise propagated from the driving circuit unit to the touch sensing layer may be blocked. Therefore, the touch sensitivity of the touch sensing layer may be improved.

In such embodiments, the first through-holes of the shielding electrode may overlap the second through-holes of the connection electrode in the second non-display area close to the display area, or the shielding electrode may not disposed in the second non-display area, such that gas generated from the planarization layer may be smoothly discharged. Therefore, the light emitting device may be prevented from being deteriorated.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
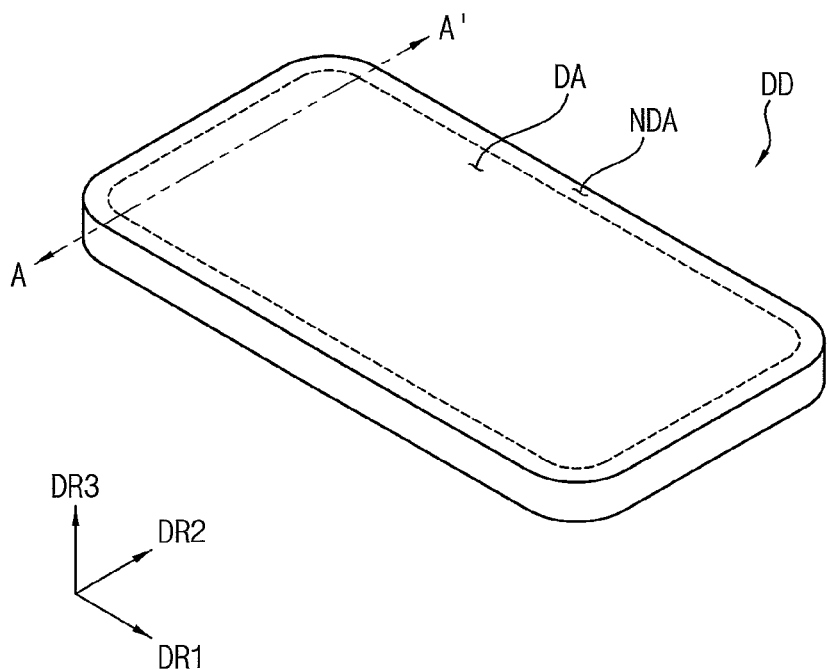
FIG. 1 is a view a perspective view showing a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a view a perspective view showing a display device according to an embodiment of the invention.

Referring to FIG. 1, an embodiment of a display device DD may display an image through a display surface. The display surface may be parallel to a surface defined by a first direction DR1 and a second direction DR2 intersecting the first direction DR1. A normal direction of the display surface (that is, a thickness direction of the display device DD) may be defined as a third direction DR3.

In an embodiment, the display device DD may include a flat display surface, but the invention is not limited thereto. In an alternative embodiment, the display device DD may include a curved display surface, a three-dimensional display surface, or the like.

In an embodiment, the display device DD may be a rigid display device, but the invention is not limited thereto. In an alternative embodiment, the display device DD may be a flexible display device.

The display surface may include a display area DA, in which an image is displayed, and a non-display area NDA, in which an image is not displayed. In one embodiment, for example, the display area DA may have a rectangular shape. The non-display area NDA may be adjacent to the display area DA. In one embodiment, for example, the non-display area NDA may surround a periphery of the display area DA.

Figure 2:
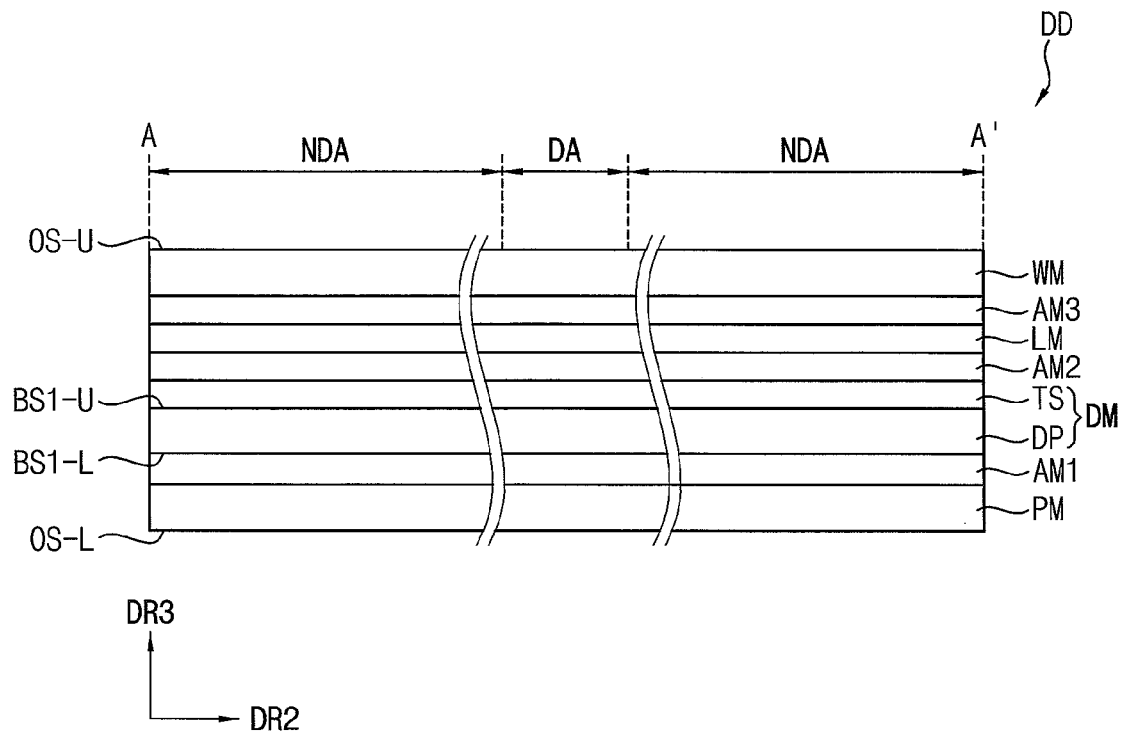
FIG. 2 is a cross-sectional view taken along line A-A' of the display device DD shown in FIG. 1.

FIG. 2 is a sectional view showing the display device DD along line A-A' of FIG. 1.

Referring to FIG. 2, an embodiment of the display device DD may include a protection member PM, a display module DM, an optical member LM, a window member WM, a first adhesive member AM1, a second adhesive member AM2, and a third adhesive member AM3.

The window member WM may be disposed above the display module DM, the optical member LM may be disposed between the display module DM and the window member WM, and the protection member PM may be disposed under the display module DM. The first adhesive member AM1 may couple the display module DM and the protection member PM to each other, the second adhesive member AM2 may couple the display module DM and the optical member LM to each other, and the third adhesive member AM3 may couple the optical member LM and the window member WM to each other.

The protection member PM may protect a lower portion of the display module DM. The protection member PM may define a first outer surface OS-L of the display device DD exposed to an outside, and may include an adhesive surface adhered to the first adhesive member AM1. The protection member PM may prevent impurities from penetrating into the display module DM from the outside, and may absorb an external shock. The protection member PM may include a plastic such as polyethersulfone ("PES"), polyacrylate, polyetherimide ("PEI"), polyethylene naphthalate ("PEN"), polyethylene terephthalate ("PET"), polyphenylene sulfide ("PPS"), polyarylate, polyimide ("PI"), or polycarbonate ("PC").

The window member WM may protect an upper portion of the display module DM, and may define a second outer surface OS-U of the display device DD exposed to a user. The window member WM may include a base layer. The base layer may include a glass, a plastic, or the like. The window member WM may further include a functional layer disposed on the base layer. The functional layer may include a hard coating layer, an anti-fingerprint layer, an anti-reflection layer, a self-healing layer, or the like.

The optical member LM may reduce an external light reflectance of the display device DD. The optical member LM may include a polarization film. In an embodiment, the optical member LM may further include a retardation film.

The display module DM may include a display panel DP and a touch sensing layer TS. In an embodiment, the display panel DP may be an organic light emitting display panel, but the invention is not limited thereto. In an alternative embodiment, the display panel DP may be a quantum dot light emitting display panel. Hereinafter, for convenience of description, embodiments where the display panel DP is an organic light emitting display panel will be described in detail.

The display panel DP may generate an image corresponding to inputted image data. The display panel DP may include a first display panel surface BS1-L and a second display panel surface BS1-U that face each other in the thickness direction DR3.

The touch sensing layer TS may be disposed directly on the display panel DP. The touch sensing layer TS may obtain coordinate information of an external input. The external input may be a touch event on the touch sensing layer TS by the user, a sensing pen, or the like. In an embodiment, the touch sensing layer TS may sense the external input in a capacitive manner. However, the operational manner of the touch sensing layer TS is not limited thereto. In an alternative embodiment, the touch sensing layer TS may sense the external input in an electromagnetic induction manner, a pressure sensing manner, or the like.

Each of the first adhesive member AM1, the second adhesive member AM2, and the third adhesive member AM3 may be an organic adhesive films such as an optically clear adhesive ("OCA") film, a pressure sensitive adhesive ("PSA") film, or the like. The organic adhesive film may include an organic adhesive material such as polyurethane-based resin, polyacrylic-based resin, polyester-based resin, polyepoxy-based resin, polyvinyl acetate-based resin, or the like.

Figure 3:
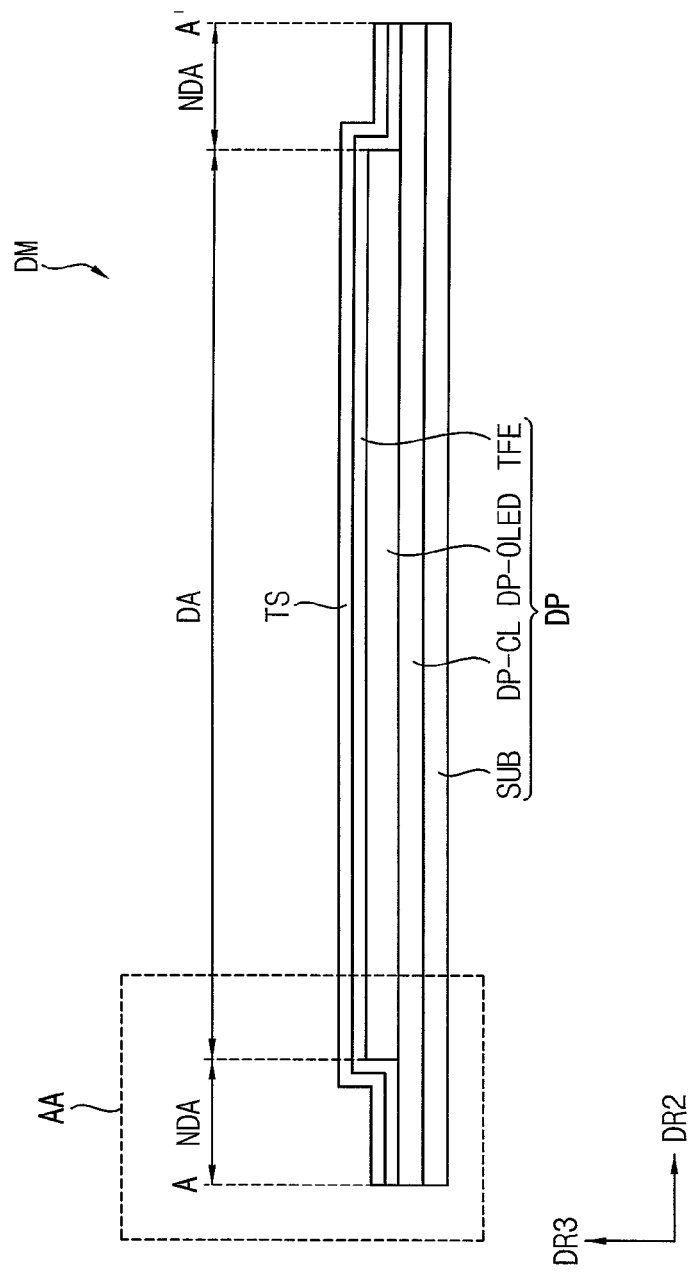
FIG. 3 is a sectional view showing an embodiment of the display module DM of the display device DD of FIG. 2.

FIG. 3 is a cross-sectional view showing an embodiment of the display module DM of the display device DD of FIG. 2.

Referring to FIG. 3, an embodiment of the display panel DP may include a base layer SUB, and a circuit device layer DP-CL, a light emitting device layer DP-OLED, and a thin film encapsulation layer TFE disposed on the base layer SUB. The base layer SUB may include a plastic substrate, a glass substrate, a metal substrate, an organic/inorganic composite material substrate, or the like.

The circuit device layer DP-CL may include a semiconductor layer, insulating layers, and conductive layers. The conductive layers of the circuit device layer DP-CL may define signal lines, a driving circuit unit, a pixel circuit unit, and the like.

The light emitting device layer DP-OLED may include a light emitting device (such as an organic light emitting diode).

The thin film encapsulation layer TFE may seal the light emitting device layer DP-OLED. The thin film encapsulation layer TFE may include an inorganic layer and an organic layer. In one embodiment, for example, the thin film encapsulation layer TFE may include two inorganic layers and a single organic layer disposed therebetween. The inorganic layer may protect the light emitting device layer DP-OLED from moisture, oxygen, and the like, and the organic layer may protect the light emitting device layer DP-OLED from foreign substances such as dust particles. The inorganic layer may include at least one material selected from silicon nitride, silicon oxynitride, silicon oxide, titanium oxide and aluminum oxide, for example. The organic layer may include an acrylic-based organic material.

The touch sensing layer TS may be disposed directly on the thin film encapsulation layer TFE. The touch sensing layer TS may include touch sensing electrodes and touch signal lines. The touch sensing electrodes and the touch signal lines may have a single layer structure or a multi-layer structure.

In an embodiment, the touch sensing electrodes and the touch signal lines may include at least one material selected from indium tin oxide ("ITO"), indium zinc oxide ("IZO"), zinc oxide (ZnO), indium tin zinc oxide ("ITZO"), poly(3, 4-ethylenedioxythiophene) ("PEDOT"), metal nanowires and graphene, for example. In an alternative embodiment, the touch sensing electrodes and the touch signal lines may include a metal such as molybdenum (Mo), silver (Ag), titanium (Ti), copper (Cu), or aluminum (Al), or a combination (e.g., an alloy) thereof.

Figure 4:
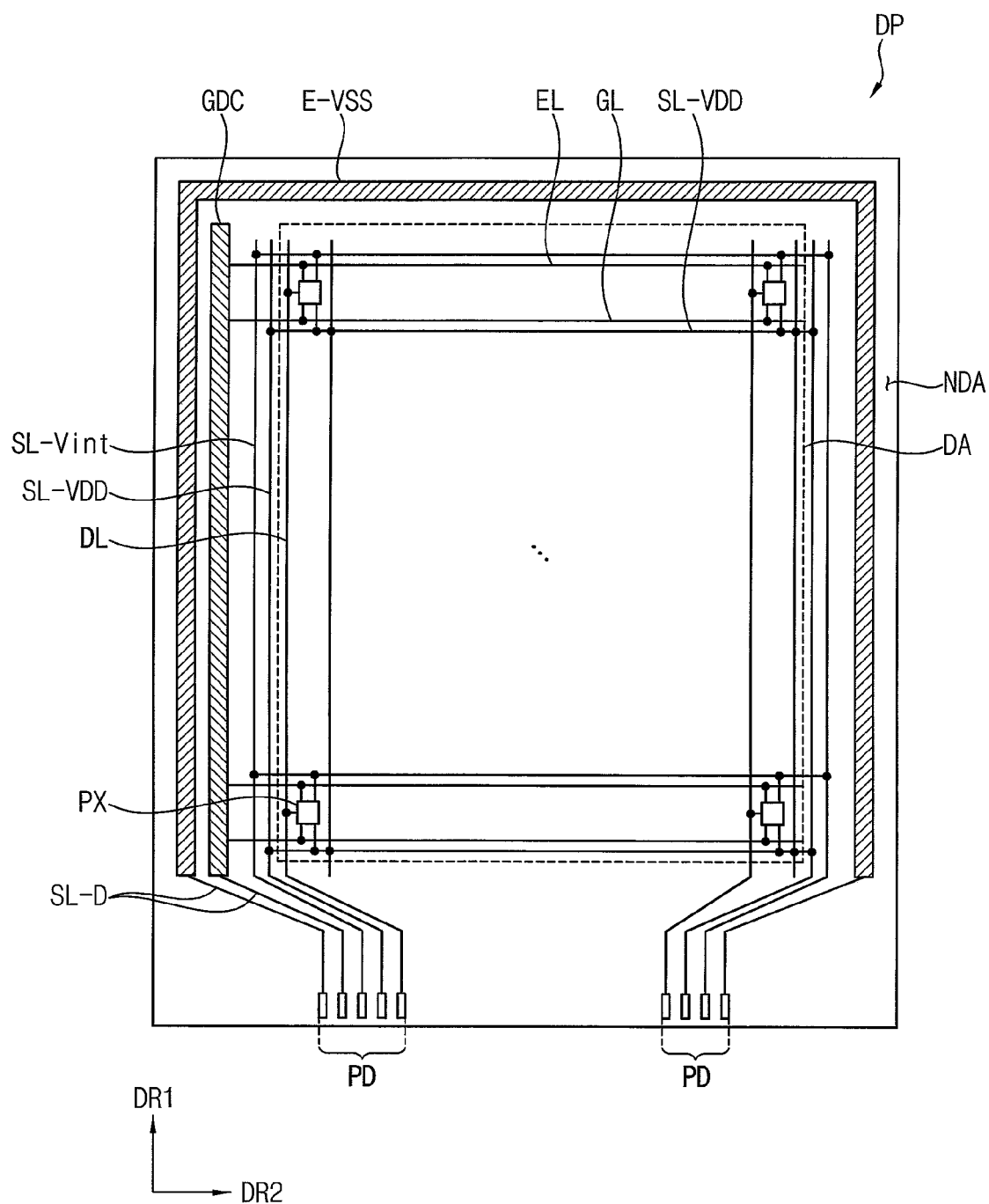
FIG. 4 is a plan view showing an embodiment of the display panel DP of the display module DM of FIG. 3.

FIG. 4 is a plan view showing an embodiment of the display panel DP of the display module DM of FIG. 3.

Referring to FIG. 4, the non-display area NDA may be defined along a periphery of the display area DA. The display area DA and the non-display area NDA of the display panel DP may correspond to the display area DA and the non-display area NDA of the display device DD, respectively.

The display panel DP may include a driving circuit unit GDC, signal lines GL, EL, DL, SL-VDD, SL-Vint, and SL-D, a power electrode E-VSS, and a plurality of pixels PX. The area, in which the pixels PX are disposed, may be defined as the display area DA.

In an embodiment, the driving circuit unit GDC may generate a plurality of scan signals, and the scan signals may be sequentially outputted to a plurality of scan lines GL, respectively. In such an embodiment, the driving circuit unit GDC may generate a plurality of light emitting control signals, and may output the emitting control signals to a plurality of light emitting control lines EL, respectively.

In an embodiment, as shown in FIG. 4, the scan signals and the light emitting control signals may be outputted from a single driving circuit unit GDC, but the invention is not limited thereto. In an alternative embodiment, a driving circuit unit for generating and outputting the scan signals and a driving circuit unit for generating and outputting the light emitting control signals may be separately provided. In one embodiment, for example, another driving circuit unit facing the driving circuit unit GDC shown in FIG. 4 in the second direction DR2 may be further provided with respect to the display area DA interposed therebetween.

The driving circuit unit GDC may be included in the circuit device layer DP-CL. The driving circuit unit GDC may include a plurality of thin film transistors provided or formed through a same process as thin film transistors of a pixel circuit unit of a pixel PX.

Although not shown in FIG. 4, the display panel DP may further include a data driving circuit unit coupled to pads PD in the form of chip-on-film ("COF"). The data driving circuit unit may be integrated in the circuit device layer DP-CL.

The signal lines GL, EL, DL, SL-VDD, SL-Vint, and SL-D may include scan lines GL, light emitting control lines EL, data lines DL, and power lines SL-VDD, an initialization voltage line SL-Vint, and a control signal line SL-D. The signal lines GL, EL, DL, SL-VDD, SL-Vint, and SL-D may be included in the circuit device layer DP-CL, and alternatively, some signal lines may be omitted. The pads PD may be connected to ends of the signal lines GL, EL, DL, SL-VDD, SL-Vint, and SL-D.

The scan lines GL may extend in the second direction DR2 and be connected to corresponding pixels PX, respectively, and the data lines DL may extend in the first direction DR1 and be connected to corresponding pixels PX, respectively. The light emitting control lines EL may be arranged in parallel with corresponding scan lines GL.

The power line SL-VDD may be connected to the pixels PX, and may provide a first power supply voltage to the pixels PX. The power line SL-VDD may include a plurality of lines extending in the first direction DR1 and a plurality of lines extending in the second direction DR2.

The initialization voltage line SL-Vint may provide an initialization voltage to the pixels PX. The initialization voltage line SL-Vint may include a plurality of lines extending in the first direction DR1 and a plurality of lines extending in the second direction DR2.

The control signal line SL-D may provide control signals to the driving circuit unit GDC. The control signal line SL-D may provide a second power supply voltage to the power electrode E-VSS. The second power supply voltage may have a voltage level different from that of the first power supply voltage. In one embodiment, for example, the second power supply voltage may have a voltage level lower than that of the first power supply voltage.

The power electrodes E-VSS may be disposed in the non-display area NDA, and may have a shape extending along the periphery of the base layer SUB. In one embodiment, for example, the power electrodes E-VSS may be disposed to face three edges of the non-display area NDA. The power electrode E-VSS may be included in the circuit device layer DP-CL. The power electrodes E-VSS may be disposed outside the driving circuit unit GDC.

The display panel DP may further include a shielding electrode (not shown). The shielding electrode may be disposed in the non-display area NDA. The shielding electrode may be directly connected to the power electrode E-VSS, and may overlap at least a part of the driving circuit unit GDC. The shielding electrode may be electrically insulated from the driving circuit unit GDC. In an embodiment, the shielding electrode overlaps at least the part of the driving circuit portion GDC, such that the shielding electrode may shield noise generated by the driving circuit unit GDC and propagated toward the touch sensing layer TS positioned above the driving circuit unit GDC. Accordingly, the touch sensitivity of the touch sensing layer TS may be improved by the shielding electrode. The shielding electrode will be described later in greater detail with reference to FIGS. 9 and 10.

Figure 5:
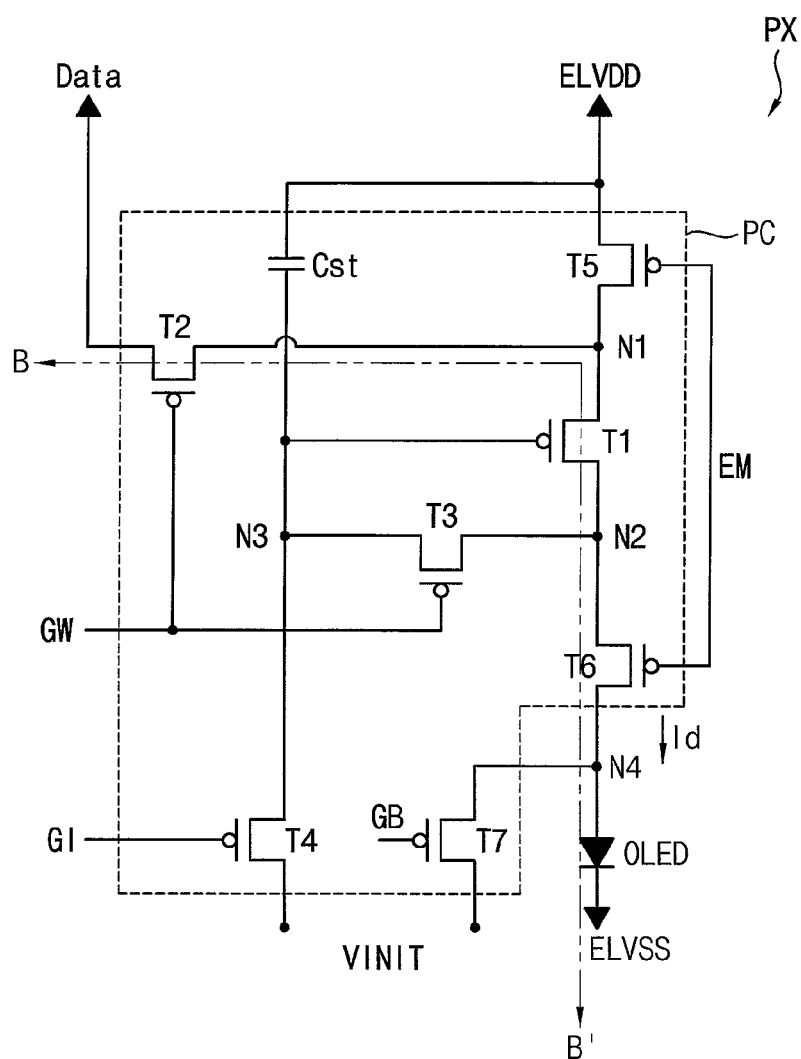
FIG. 5 is a circuit diagram showing an embodiment of a pixel PX of the display panel DP of FIG. 4.

FIG. 5 is a circuit diagram showing an embodiment of the pixel PX included in the display panel DP of FIG. 4.

Referring to FIG. 5, an embodiment of the pixel PX may include a pixel circuit unit PC and a light emitting device OLED. In an embodiment, the pixel circuit unit PC may include first to seventh transistors T1 to T7 and a capacitor Cst.

A data signal Data, a first scan signal GW, a second scan signal GI, a third scan signal GB, and a light emitting control signal EM may be provided to the pixel PX. The second scan signal GI may be the same as a first scan signal GW of a previous pixel or a previous row. In one embodiment, for example, a second scan signal GI[n] provided to a pixel PX of the n-th row may be the same as a first scan signal GW[n−1] provided to a pixel PX of an (n−1)-th row. In an embodiment, the third scan signal GB may be the same as a first scan signal GW of a next pixel or a next row. In one embodiment, for example, a third scan signal GI[n] provided to the pixel PX of the n-th row may be the same as a first scan signal GW[n+1] provided to a pixel PX of an (n+1)-th row.

Each of the first to seventh transistors T1 to T7 may include a first electrode, a second electrode, and a gate electrode. One of the first electrode and the second electrode may be a source electrode, and the other of the first electrode and the second electrode may be a drain electrode.

Each of the first to seventh transistors T1 to T7 may be a thin film transistor. In one embodiment, for example, each of the first to seventh transistors T1 to T7 may be a P-type metal-oxide-semiconductor ("PMOS") transistor or an N-type metal-oxide-semiconductor ("NMOS") transistor. Hereinafter, for convenience of description, embodiments where each of the first to seventh transistors T1 to T7 is the PMOS transistor will be described in detail.

The light emitting device OLED may be electrically connected to the pixel circuit unit PC. The light emitting device OLED may include an anode electrode and a cathode electrode. The anode electrode of the light emitting device OLED may be connected to a fourth node N4, and the cathode electrode may be connected to a wire that transmits the second power voltage ELVSS.

The first transistor T1 (or a driving transistor) may include a first electrode connected to a first node N1, a second electrode connected to a second node N2, and a gate electrode connected to a third node N3. The first transistor T1 may provide a driving current Id to the light emitting device OLED based on a voltage of the third node N3 (or a voltage stored in the capacitor Cst).

The second transistor T2 (or a switching transistor) may include a first electrode configured to receive a data signal Data, a second electrode connected to the first node N1, and a gate electrode configured to receive the first scan signal GW. The second transistor T2 may be turned on in response to the first scan signal GW, and may transmit the data signal Data to the first node N1.

The third transistor T3 may include a first electrode connected to the second node N2, a second electrode connected to the third node N3, and a gate electrode configured to receive the first scan signal GW. The third transistor T3 may be turned on in response to the first scan signal GW, and may diode-connect the second electrode and the gate electrode of the first transistor T1 to each other.

The capacitor Cst may be connected between the third node N3 and the wire for transmitting the first power voltage ELVDD. The capacitor Cst may store or maintain the data signal Data.

The fourth transistor T4 may include a first electrode connected to the third node N3, a second electrode connected to receive an initialization voltage VINIT, and a gate electrode connected to receive a second scan signal GI. The fourth transistor T4 may be turned on in response to the second scan signal GI before the data signal Data is stored in the capacitor Cst, and may initialize the third node N3 by using the initialization voltage VINIT.

In an embodiment, the third and fourth transistors T3 and T4 may be a dual transistor (that is, a transistor in which two transistors are combined with each other). In such an embodiment, leakage currents of the third and fourth transistors T3 and T4 may be reduced.

The fifth and sixth transistors T5 and T6 (or first and second light emitting control transistors) may form a current movement path through which the driving current Id transmitted from the first transistor T1 flows.

The fifth transistor T5 may include a first electrode connected to receive a first power voltage ELVDD; a second electrode connected to the first node N1, and a gate electrode connected to receive a light emitting control signal EM. The sixth transistor T6 may include a first electrode connected to the second node N2, a second electrode connected to the fourth node N4 (or the anode electrode of the light emitting device OLED), and a gate electrode connected to receive a light emitting control signal EM.

The fifth and sixth transistors T5 and T6 may be turned on in response to the light emitting control signal EM. Accordingly, the driving current Id may be provided to the light emitting device OLED, and the light emitting device OLED may emit light having a luminance corresponding to the driving current Id.

The seventh transistor T7 may include a first electrode connected to the fourth node N4, a second electrode connected to receive an initialization voltage VINIT, and a gate electrode connected to receive the third scan signal GB. The seventh transistor T7 may be turned on in response to the third scan signal GB, and may initialize the anode electrode of the light emitting device OLED by using the initialization voltage VINIT. The light emitting device OLED may include a parasitic capacitor, and the parasitic capacitor may be charged or discharged by the driving current Id while the light emitting device OLED is emitting the light, such that the anode electrode of the light emitting device OLED may have an irregular voltage. Accordingly, the parasitic capacitor of the light emitting diode OLED may be initialized through the seventh transistor T7.

Figure 6:
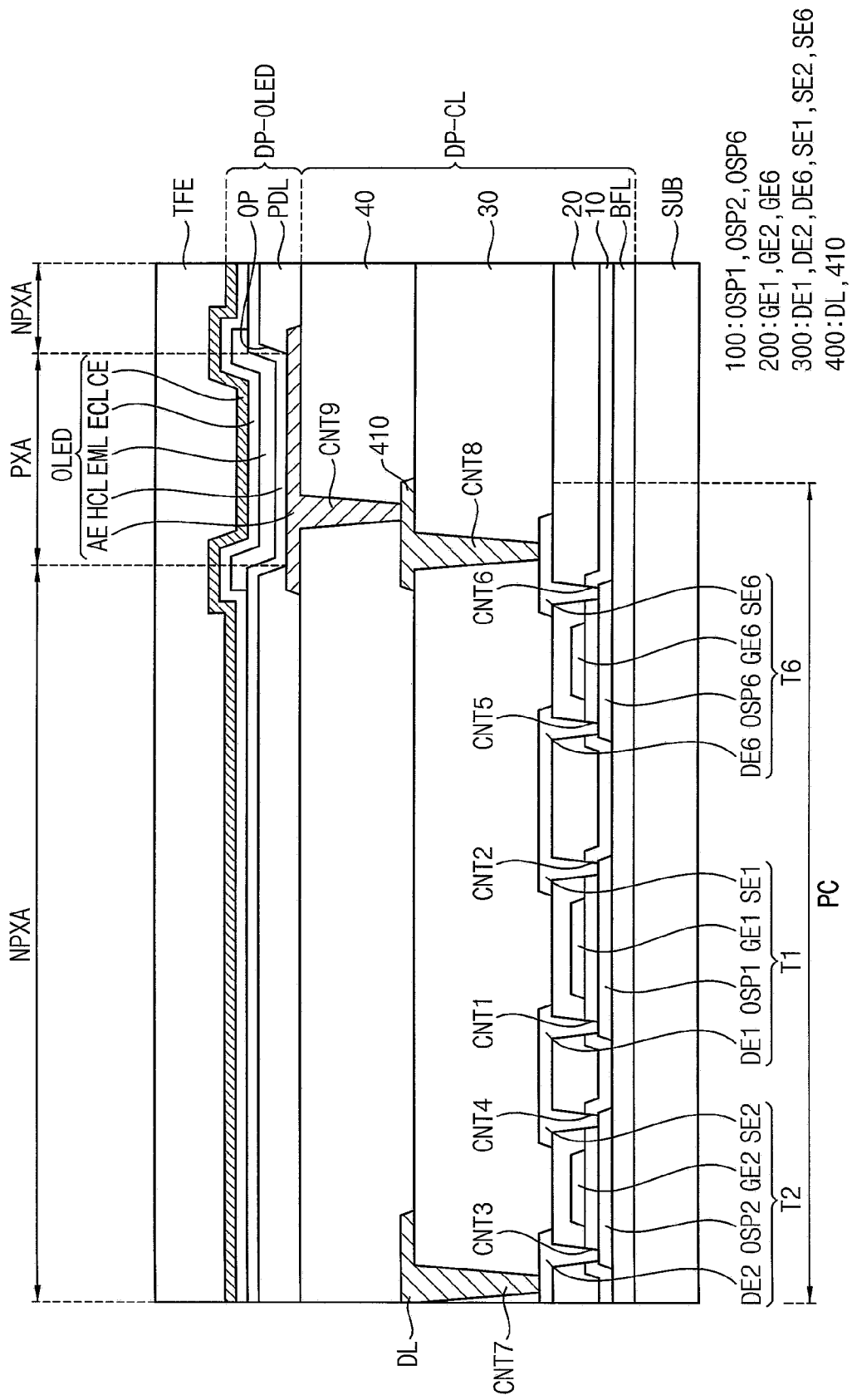
FIG. 6 is a cross-sectional view showing an embodiment of a pixel PX corresponding to line B-B' of FIG. 5.

FIG. 6 is a cross-sectional view showing an embodiment of a pixel PX corresponding to line B-B' of FIG. 5.

Referring to FIG. 6, an embodiment of the pixel PX may include a base layer SUB, a circuit device layer DP-CL, a light emitting device layer DP-OLED, and a thin film encapsulation layer TFE.

The circuit device layer DP-CL may be disposed on the base layer SUB. The circuit device layer DP-CL may include a buffer layer BFL, a semiconductor layer 100, a first insulating layer 10, a first conductive layer 200, a second insulating layer 20, a second conductive layer 300, a first planarization layer 30, a third conductive layer 400, and a second planarization layer 40.

The buffer layer BFL may be disposed on the base layer SUB. The buffer layer BFL may provide a flat surface on the base layer SUB, and may prevent impurities from upwardly permeating into the base layer SUB. The buffer layer BFL may include an inorganic material. Alternatively, the buffer layer BFL may be omitted.

The semiconductor layer 100 may be disposed on the buffer layer BFL. The semiconductor layer 100 may include a semiconductor pattern OSP1 of the first transistor T1 (hereinafter, referred to as a first semiconductor pattern), a semiconductor pattern OSP2 of the first transistor T2 (hereinafter, referred to as a second semiconductor pattern), and a semiconductor pattern OSP6 of the first transistor T6 (hereinafter, referred to as a sixth semiconductor pattern). The first semiconductor pattern OSP1, the second semiconductor pattern OSP2, and the sixth semiconductor pattern OSP6 may include at least one selected from an amorphous silicon, a polycrystalline silicon and an oxide semiconductor, for example.

The first insulating layer 10 may be disposed on the semiconductor layer 100. The first insulating layer 10 may include an inorganic material, such as silicon nitride, silicon oxide, or silicon oxynitride.

The first conductive layer 200 may be disposed on the first insulating layer 10. The first conductive layer 200 may include a gate electrode GE1 (hereinafter, referred to as a first gate electrode) of the first transistor T1, a gate electrode GE2 (hereinafter, referred to as a second gate electrode) of the second transistor T2, and a gate electrode GE6 of the sixth transistor T6 (hereinafter, referred to as a sixth gate electrode). The first gate electrode GE1, the second gate electrode GE2, and the sixth gate electrode GE6 may be formed through a same process as the scan lines (GL in FIG. 4).

The second insulating layer 20 may be disposed on the first conductive layer 200. The second insulating layer 20 may cover the first gate electrode GE1, the second gate electrode GE2, and the sixth gate electrode GE6. The second insulating layer 20 may include an inorganic material, such as silicon nitride, silicon oxide, or silicon oxynitride.

The second conductive layer 300 may be disposed on the second insulating layer 20. The second conductive layer 300 may include an input electrode SE1 (hereinafter, referred to as a first input electrode) and an output electrode DE1 (hereinafter, referred to as a first output electrode) of the first transistor T1, an input electrode SE2 (hereinafter, referred to as a second input electrode) and an output electrode DE2 (hereinafter, referred to as a second output electrode) of the second transistor T2, and an input electrode SE6 (hereinaf-ter, referred to as a sixth input electrode) and an output electrode DE6 (hereinafter, referred to as a sixth output electrode) of the sixth transistor T6.

The first output electrode DE1 and the first input electrode SE1 may be connected to the first semiconductor pattern OSP1 through a first contact hole CNT1 and a second contact hole CNT2, respectively, which are defined through the first insulating layer 10 and the second insulating layer 20. The second output electrode DE2 and the second input electrode SE2 may be connected to the second semiconductor pattern OSP2 through a third contact hole CNT3 and a fourth contact hole CNT4, respectively, which are defined through the first insulating layer 10 and the second insulating layer 20. The second input electrode SE2 may be electrically connected or integrally formed as a single unitary unit with the first output electrode DE1. The sixth output electrode DE6 and the sixth input electrode SE6 may be connected to the sixth semiconductor pattern OSP6 through a fifth contact hole CNT5 and a sixth contact hole CNT6, respectively, which are defined through the first insulating layer 10 and the second insulating layer 20. The sixth input electrode SE6 may be electrically connected or integrally formed as a single unitary unit with the first input electrode SE1. In an embodiment, each of the first transistor T1, the second transistor T2, and the sixth transistor T6 may have a top gate structure, but the invention is not limited thereto. In an alternative embodiment, at least one of the first transistor T1, the second transistor T2, and the sixth transistor T6 may have a bottom gate structure.

The first planarization layer 30 may be disposed on the second conductive layer 300. The first planarization layer 30 may cover the first input electrode SE1, the first output electrode DE1, the second input electrode SE2, the second output electrode DE2, the sixth input electrode SE6, and the first output electrode DE6. The first planarization layer 30 may have a flat top surface to provide a flat surface on the lower therebelow. The first planarization layer 30 may include an organic material.

The third conductive layer 400 may be disposed on the first planarization layer 30. The third conductive layer 400 may include a data line DL and a pixel connection electrode 410. The data line DL may be connected to the second output electrode DE2 of the second transistor T2 through a seventh contact hole CNT7 defined through the first planarization layer 30. The pixel connection electrode 410 may be connected to the sixth input electrode SE6 of the sixth transistor T6 through an eighth contact hole CNT8 defined through the first planarization layer 30.

In an embodiment, although not shown in FIG. 6, the third conductive layer 400 may further include a shielding electrode disposed in the non-display area NDA. The shielding electrode will be described later in greater detail with reference to FIG. 9.

The second planarization layer 40 may be disposed on the third conductive layer 400. The second planarization layer 40 may cover the data line DL and the pixel connection electrode 410. The second planarization layer 40 may have a flat top surface to provide a flat surface on the layers therebelow. The second planarization layer 40 may include an organic material.

The light emitting device layer DP-OLED may be disposed on the circuit device layer DP-CL. The light emitting device layer DP-OLED may include a light emitting device including a first electrode AE, a hole control layer HCL, a light emitting layer EML, an electronic control layer ECL, and a second electrode CE, and a pixel defining layer PDL.

The first electrode AE may be disposed on the second planarization layer 40. The first electrode AE may be connected to the pixel connection electrode 410 through a ninth contact hole CNT9 defined through the second planarization layer 40. In such an embodiment where the pixel connection electrode 410 is connected to the sixth input electrode SE6, the first electrode AE may be electrically connected to the sixth transistor T6 through the pixel connection electrode 410.

The pixel defining layer PDL may be disposed on the first electrode AE. An opening OP may be defined in the pixel defining layer PDL. The opening OP of the pixel defining layer PDL may expose at least a part of the first electrode AE.

The pixel PX may be disposed in the display area DA when viewed in a plan view in a thickness direction of the display module DM or the third direction DR3. The display area DA may include a light emitting area PXA and a non-light emitting area NPXA adjacent to the light emitting area PXA. The non-light emitting area NPXA may surround the light emitting area PXA. The light emitting area PXA may be defined to correspond to the part of the first electrode AE exposed by the opening OP.

The hole control layer HCL may be disposed on the first electrode AE and the pixel defining layer PDL. The hole control layer HCL may be provided in common in the light emitting area PXA and the non-light emitting area NPXA. In such an embodiment, the hole control layer HCL may be formed in common in the pixels PX.

The light emitting layer EML may be disposed on the hole control layer HCL. The light emitting layer EML may be disposed in an area corresponding to the opening OP of the pixel defining layer PDL. In such an embodiment, the light emitting layer EML may be formed separately from each of the pixels PX. The light emitting layer EML may include an organic material.

The electronic control layer ECL may be disposed on the light emitting layer EML. The electronic control layer ECL may be provided in common in the light emitting area PXA and the non-light emitting area NPXA. In such an embodiment, the electronic control layer ECL may be formed in common in the pixels PX.

The second electrode CE may be disposed on the electronic control layer ECL. The second electrode CE may be provided in common in the light emitting area PXA and the non-light emitting area NPXA. In such an embodiment, the second electrode CE may be formed in common in the pixels PX.

The thin film encapsulation layer TFE may be disposed on the second electrode CE. The thin film encapsulation layer TFE may be provided in common in the pixels PX. The thin film encapsulation layer TFE may directly cover the second electrode CE. In an embodiment, a capping layer covering the second electrode CE may be further disposed between the thin film encapsulation layer TFE and the second electrode CE. In such an embodiment, the thin film encapsulation layer TFE may directly cover the capping layer.

Figure 7:
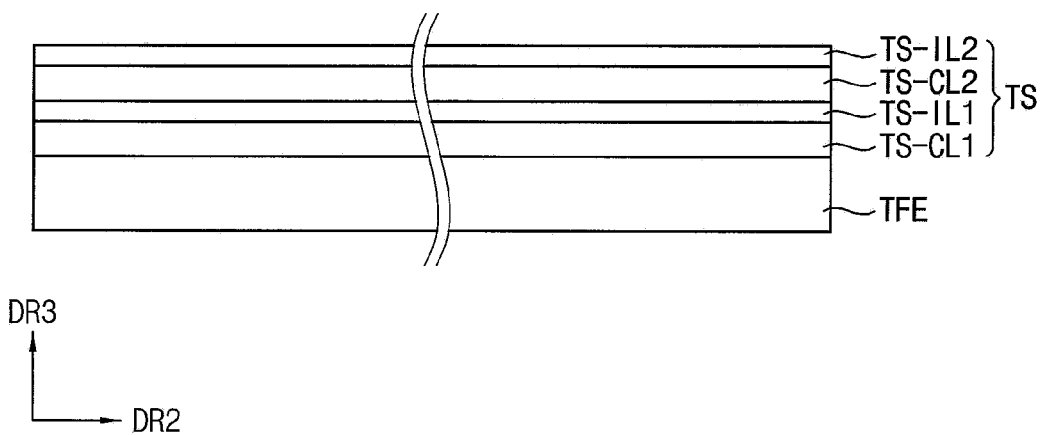
FIG. 7 is a cross-sectional view showing an embodiment of a touch sensing layer TS of the display module DM of FIG. 3.

FIG. 7 is a cross-sectional view showing an embodiment of the touch sensing layer TS of the display module DM of FIG. 3.

Referring to FIG. 7, the touch sensing layer TS may include a first conductive layer TS-CL1 (hereinafter, referred to as a first touch conductive layer), a first insulating layer TS-IL1 (hereinafter, referred to as a first touch insulating layer), a second conductive layer TS-CL2 (hereinafter, referred to as a second touch conductive layer), and a second insulating layer TS-IL2 (hereinafter, referred to as a second touch insulating layer).

The first touch conductive layer TS-CL1 may be disposed directly on the thin film encapsulation layer TFE. Each of the first touch conductive layer TS-CL1 and the second touch conductive layer TS-CL2 may have a single layer structure or may have a multi-layer structure laminated along the third direction DR3. Each of the first touch conductive layer TS-CL1 and the second touch conductive layer TS-CL2 may include a transparent conductive layer and/or a metal layer. The transparent conductive layer may include at least one material selected from ITO, IZO, ZnO, ITZO, PEDOT, metal nanowires, and graphene, for example. The metal layer may include at least one material selected from Mo, Al, T1, Cu and Al, for example. In one embodiment, for example, each of the first touch conductive layer TS-CL1 and the second touch conductive layer TS-CL2 may have a three-layer structure of T1/Al/T1.

Each of the first touch insulating layer TS-IL1 and the second touch insulating layer TS-IL2 may include an inorganic material or an organic material. The inorganic material may include at least one material selected from aluminum oxide, titanium oxide, silicon oxide, silicon oxynitride, zirconium oxide, and hafnium oxide. The organic material may include at least one material selected from acrylic-based resin, methacrylic-based resin, polyisoprene-based, vinyl-based resin, epoxy-based resin, urethane-based resin, cellulose-based resin, siloxane-based resin, polyimide-based resin, polyamide-based resin, and perylene-based resin.

Each of the first touch insulating layer TS-IL1 and the second touch insulating layer TS-IL2 may have a single layer structure or a multi-layer structure. The first touch insulating layer TS-IL1 may insulate the first touch conductive layer TS-CL1 and the second touch conductive layer TS-CL2.

Figure 8:
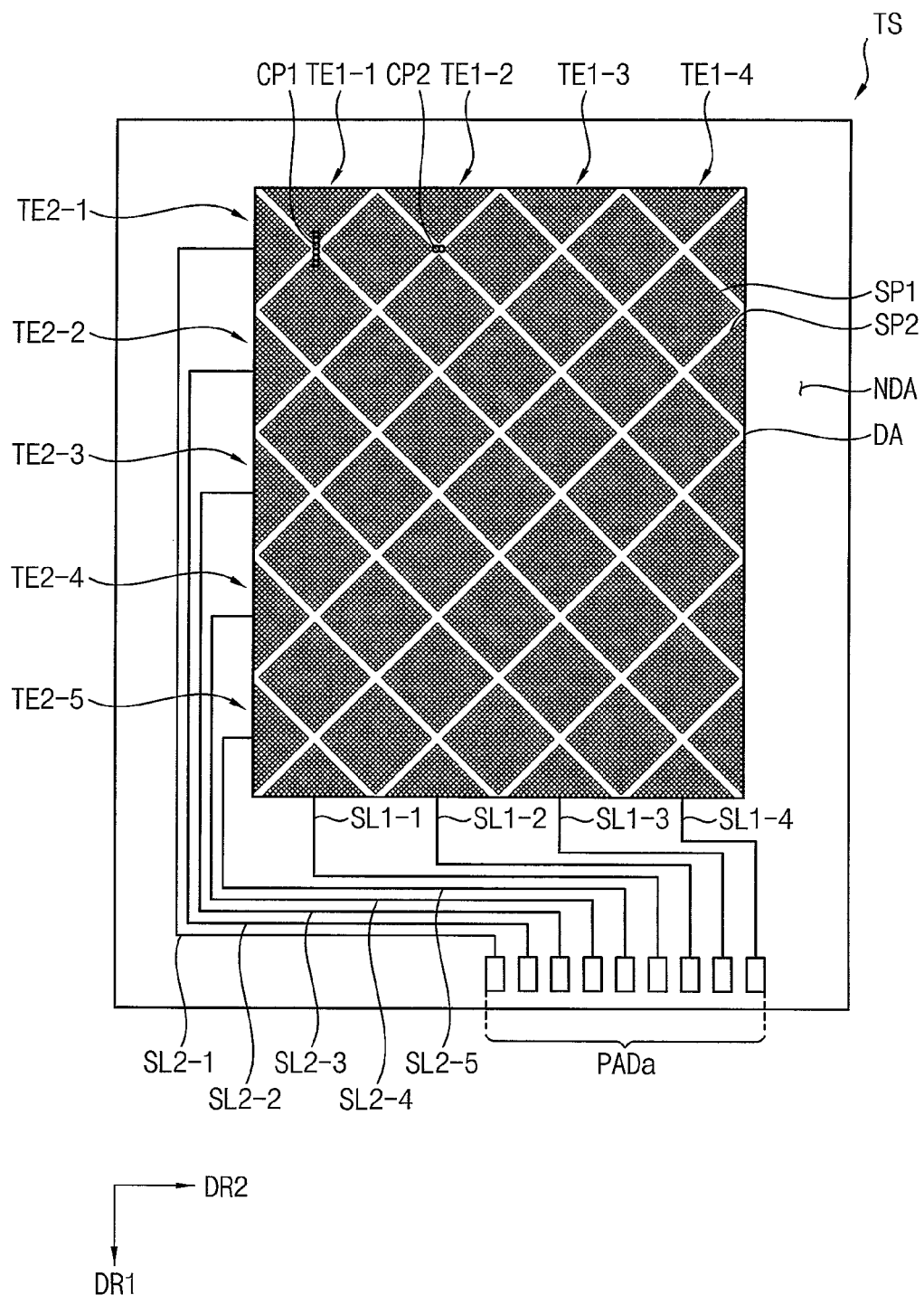
FIG. 8 is a plan view showing an embodiment of the touch sensing layer TS of FIG. 7.

FIG. 8 is a plan view showing an embodiment of the touch sensing layer TS of FIG. 7.

Referring to FIG. 8, the touch sensing layer TS may include first touch sensing electrodes TE1-1 to TE1-4 (or first to fourth driving electrodes), first touch signal lines SL1-1 to SL1-4 (or first to fourth driving signal lines) connected to the first touch sensing electrodes TE1-1 to TE1-4, second touch sensing electrodes TE2-1 to TE2-5 (or first to fifth sensing electrodes), second touch signal lines SL2-1 to SL2-5 (or first to fifth sensing signal lines) connected to the second touch sensing electrodes TE2-1 to TE2-5, and pad portions PADa connected to the first touch signal lines SL1-1 to SL1-4 and the second touch signal lines SL2-1 to SL2-5, respectively. Although FIG. 8 illustrates an embodiment where the touch sensing layer TS includes four first touch sensing electrodes TE1-1 to TE1-4 and five second touch sensing electrodes TE2-1 to TE2-5, the number of the first touch sensing electrodes TE1-1 to TE1-4 and the number of the second touch sensing electrodes TE2-1 to TE2-5 are not limited thereto.

Each of the first touch sensing electrodes TE1-1 to TE1-4 may have a mesh shape in which a plurality of touch openings are defined. Each of the first touch sensing electrodes TE1-1 to TE1-4 may include a plurality of first touch sensor portions SP1 and a plurality of first connection portions CP1. The first touch sensor portions SP1 may be arranged along the first direction DR1. Each of the first connection portions CP1 may connect two adjacent first touch sensor portions SP1 to each other among the first touch sensor portions SP1.

The second touch sensing electrodes TE2-1 to TE2-5 may be insulated from and alternately arranged with the first touch sensing electrodes TE1-1 to TE1-4. Each of the second touch sensing electrodes TE2-1 to TE2-5 may have a mesh shape in which a plurality of touch openings are defined. Each of the second touch sensing electrodes TE2-1 to TE2-5 may include a plurality of second touch sensor portions SP2 and a plurality of second connection portions CP2. The second touch sensor portions SP2 may be arranged along the second direction DR2. Each of the second connection portions CP2 may connect two adjacent second touch sensor portions SP2 to each other among the second touch sensor portions SP2.

The first touch sensing electrodes TE1-1 to TE1-4 and the second touch sensing electrodes TE2-1 to TE2-5 may be electro-statically coupled to each other. Sensing signals are applied to the first touch sensing electrodes TE1-1 to TE1-4, so that capacitors may be formed between the first touch sensor portions SP1 and the second touch sensor portions SP2.

One part of the first touch sensor portions SP1, the first connection portions CP1, the first touch signal lines SL1-1 to SL1-4, the second touch sensor portions SP2, the second connection portions CP2 and the second touch signal lines SL2-1 to SL2-5 may be formed by patterning the first touch conductive layer (TS-CL1 of FIG. 7), and the other part thereof may be formed by patterning the second touch conductive layer (TS-CL2 of FIG. 7). Although FIG. 8 illustrates an embodiment where each of the first touch sensor portions SP1 and the second touch sensor portions SP2 has a rhombus shape, the shape of each first touch sensor portions SP1 and the second touch sensor portions SP2 is not limited thereto.

Figure 9:
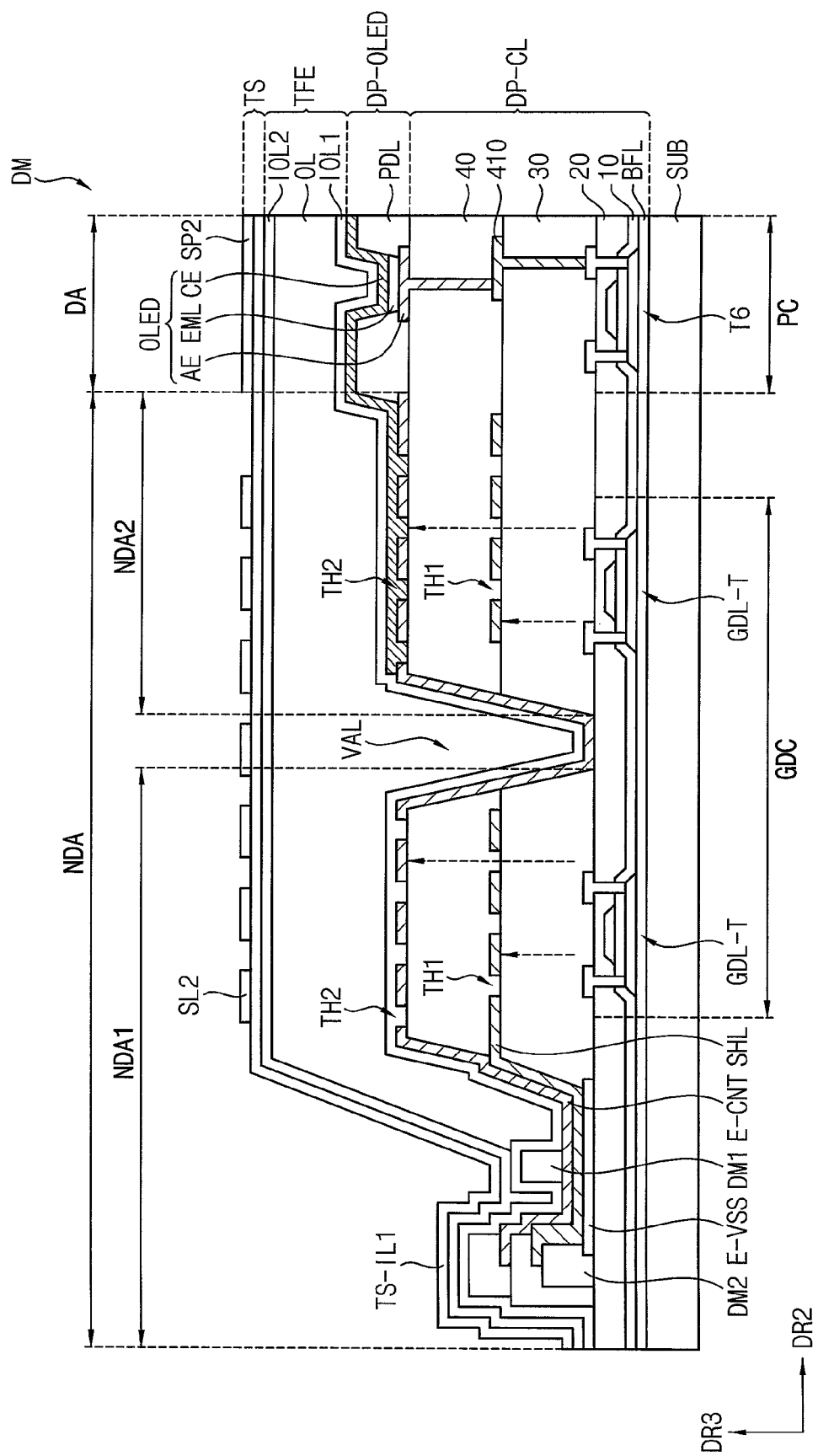
FIG. 9 is a cross-sectional view showing an embodiment of the display module DM corresponding to the area AA of FIG. 3.

FIG. 9 is a cross-sectional view showing an embodiment of the display module DM corresponding to the area AA of FIG. 3.

Referring to FIG. 9, each laminated structure of the circuit device layer DP-CL, the light emitting device layer DP-OLED, and the thin film encapsulation layer TFE disposed in the display area DA is substantially the same as the laminated structure described above with reference to FIG. 6, and any repetitive detailed descriptions thereof will hereinafter be omitted. For convenience of illustration, although the hole control layer HCL and the electronic control layer ECL are omitted in FIG. 9, it will be understood that the light emitting device layer DP-OLED includes the hole control layer HCL and the electronic control layer ECL.

In such an embodiment, a laminated structure of the touch sensing layer TS disposed in the display area DA is substantially the same as the laminated structure described above with reference to FIG. 7, and any repetitive detailed descriptions thereof will be omitted. For convenience of illustration, although the first touch conductive layer TS-CL1 and the second touch insulating layer TS-IL2 are omitted in FIG. 9, it will be understood that the touch sensing layer TS includes a first touch conductive layer TS-CL1 and a second touch insulating layer TS-IL2.

FIG. 9 illustrates an embodiment where the thin film encapsulation layer TFE includes a first inorganic layer IOL1, an organic layer OL, and a second inorganic layer IOL2.

Hereinafter, the non-display area NDA will be mainly described.

The non-display area NDA may include a first non-display area NDA1 and a second non-display area NDA2. The second non-display area NDA2 may be positioned between the display area DA and the first non-display area NDA1. The first non-display area NDA1 may be positioned at a portion far from the display area DA in the non-display area NDA, and the second non-display area NDA2 may be positioned at a portion near the display area DA in the non-display area NDA. In such an embodiment, the second non-display area NDA2 may be positioned outside (or outwardly from) the display area DA, and the first non-display area NDA1 may be positioned outside the second non-display area NDA2.

The circuit device layer DP-CL may include a driving circuit unit GDC, a power electrode E-VSS, and a shielding electrode SHL.

The driving circuit unit GDC may overlap the first non-display area NDA1 and the second non-display area NDA2. The driving circuit unit GDC may include at least one transistor GDL-T formed through a same process as the sixth transistor T6 of the pixel circuit unit PC.

The power electrode E-VSS may be disposed on the second insulating layer 20. The power electrodes E-VSS may overlap the first non-display area NDA1. In an embodiment, as shown in FIG. 4, the power electrodes E-VSS may be disposed outside the driving circuit unit GDC. The power electrode E-VSS may be formed in a same layer through a same process as the sixth input electrode and the sixth output electrode of the sixth transistor T6, and may include a same material as the sixth input electrode and the sixth output electrode of the sixth transistor T6.

In an embodiment, a valley VAL positioned between the first non-display area NDA1 and the second non-display area NDA2 may be defined in the first planarization layer 30 and the second planarization layer 40. The first non-display area NDA1 and the second non-display area NDA2 may be defined by the valley VAL. The valley VAL may physically separate the first and second planarization layers 30 and 40 positioned in the first non-display area NDA1 and the first and second planarization layers 30 and 40 positioned in the second non-display area NDA2. In such an embodiment, where the valley VAL is formed in the first and second planarization layers 30 and 40, which are commonly formed in the display area DA and the non-display area NDA, impurities such as gas and moisture may be prevented from being transferred from the outside to the display area DA through the non-display area NDA via the first and second planarization layers 30 and 40.

The shielding electrode SHL may be disposed on the first planarization layer 30. The shielding electrode SHL may be connected to the power electrode E-VSS, and may overlap the driving circuit unit GDC. The shielding electrode SHL may overlap the first non-display area NDA1 and the second non-display area NDA2. The shielding electrode SHL may be formed in a same layer through a same process as the pixel connection electrode 410, and may include a same material as the pixel connection electrode 410.

The shielding electrode SHL may not overlap the valley VAL. In such an embodiment, the shielding electrode SHL may not be formed between the first non-display area NDA1 and the second non-display area NDA2.

A plurality of first through-holes TH1 may be defined in the shielding electrode SHL. The first through-holes TH1 may expose the first planarization layer 30. In one embodiment, for example, the first through-holes TH1 may expose a portion of the top surface of the first planarization layer 30. The first through-holes TH1 may discharge gas generated from the first planarization layer 30.

The light emitting device layer DP-OLED may include a connection electrode E-CNT and a second electrode CE.

The connection electrode E-CNT may be disposed on the second planarization layer 40. A part of the connection electrode E-CNT may be in contact with the shielding electrode SHL. Accordingly, the connection electrode E-CNT may electrically connect the power electrode E-VSS to the second electrode CE. The connection electrode E-CNT may transfer the second power voltage from the power electrode E-VSS to the second electrode CE. The connection electrode E-CNT may be formed in a same layer through a same process as the first electrode AE, and may include a same material as the first electrode AE.

The connection electrode E-CNT may overlap the valley VAL. The connection electrode E-CNT may be formed along the valley VAL to cover a top surface of the second insulating layer 20, a side surface of the first planarization layer 30, and a side surface of the second planarization layer 40.

A plurality of second through-holes TH2 may be defined in the connection electrode E-CNT. The second through-holes TH2 may expose the second planarization layer 40. In one embodiment, for example, the second through-holes TH2 may expose a part of a top surface of the second planarization layer 40. The second through-holes TH2 may discharge gas generated from the first planarization layer 30 and the second planarization layer 40.

The second through-holes TH2 of the connection electrode E-CNT may not overlap the valley VAL. In such an embodiment, the second through-holes TH2 may not be formed in the valley VAL. In such an embodiment, where the first and second planarization layers 30 and 40 including the organic material are not formed in the valley VAL, the second through-holes TH2 for discharging the gas may not be formed. The second electrode CE may be disposed on the connection electrode E-CNT.

The second electrode CE may overlap the second non-display area NDA2, and may not overlap the first non-display area NDA1. In such an embodiment, the second electrode CE may extend from the display area DA to the second non-display area NDA2. The second electrode CE may cover the second through-holes TH2 of the connection electrode E-CNT in the second non-display area NDA2.

The first through-holes TH1 of the shielding electrode SHL and the second through-holes TH2 of the connection electrode E-CNT may not overlap each other in the first non-display area NDA1. In a conventional display module, the first through-holes TH1 of the shielding electrode SHL and the second through-holes TH2 of the connection electrode E-CNT may overlap each other in the first non-display area NDA1, such that noise may be propagated from the driving circuit unit GDC to the touch sensing layer TS through the first through-holes TH1 and the second through-holes TH2 that overlap each other, and the noise may exert an effect on the touch signal lines SL2, thereby reducing the touch sensitivity of the touch sensing layer TS. In an embodiment of the invention, the first through-holes TH1 of the shielding electrode SHL and the second through-holes TH2 of the connection electrode E-CNT do not overlap each other in the first non-display area NDA1, such that the noise propagated from the driving circuit unit GDC toward the touch sensing layer TS may be blocked by the shielding electrode SHL or the connection electrode E-CNT. Accordingly, the touch sensitivity of the touch sensing layer TS may be improved.

The first through-holes TH1 of the shielding electrode SHL and the second through-holes TH2 of the connection electrode E-CNT may overlap each other in the second non-display area NDA2. In a conventional display module, the first through-holes TH1 of the shielding electrode SHL and the second through-holes TH2 of the connection electrode E-CNT may not overlap each other in the second non-display area NDA2 close to the display area DA, such that the gas generated from the first planarization layer 30 and/or the second planarization layer 40 may move to the display area DA without being smoothly discharged through the first through-holes TH1 and/or the second through-holes TH2, and the gas may exert an effect on the light emitting layer EML, thereby deteriorating the light emitting device OLED. In an embodiment of the invention, the first through-holes TH1 of the shielding electrode SHL and the second through-holes TH2 of the connection electrode E-CNT overlap each other in the second non-display area NDA2, such that the gas generated from the first planarization layer 30 and/or the second planarization layer 40 may be smoothly discharged through the first through-holes TH1 and/or the second through-holes TH2. Accordingly, the light emitting device OLED may be prevented from being deteriorated.

In an embodiment, even when the first through-holes TH1 of the shielding electrode SHL and the second through-holes TH2 of the connection electrode E-CNT overlap each other in the second non-display area NDA2, the second electrode CE covers the second through-holes TH2 in the second non-display area NDA2, so that the noise propagated from the driving circuit unit GDC toward the touch sensing layer TS may be blocked by the shielding electrode SHL or the second electrode CE. Accordingly, the touch sensitivity of the touch sensing layer TS may be improved.

In an embodiment, dams DM1 and DM2 may be disposed in the first non-display area NDA1.

The first dam DM1 and the second dam DM2 may be spaced apart from each other in the second direction DR2. In an embodiment, although not shown in FIG. 9, the first dam DM1 and the second dam DM2 may be disposed while surrounding the display area DA when viewed in a plan view.

The first dam DM1 may be disposed on the power electrode E-VSS. The first dam DM1 may have a single layer structure. The first dam DM1 may be formed through a same process as the pixel defining layer PDL, and may include a same material as the pixel defining layer PDL. The first dam DM1 may have a thickness smaller than that of the pixel defining layer PDL.

The second dam DM2 may be disposed outside the first dam DM1. In one embodiment, for example, a distance between the second dam DM2 and the display area DA may be greater than a distance between the first dam DM1 and the display area DA.

The second dam DM2 may cover a part of the power electrode E-VSS. The second dam DM2 may have a multi-layer structure. A first layer of the second dam DM2 may be formed through a same process as the first planarization layer 30, and may include a same material as the first planarization layer 30. A second layer of the second dam DM2 may be formed through a same process as the second planarization layer 40, and may include a same material as the second planarization layer 40. A third layer of the second dam DM2 may be formed through a same process as the pixel defining layer PDL, and may include a same material as the pixel defining layer PDL.

The first inorganic layer IOL1 may cover the first dam DM1 and the second dam DM2. An end of the first inorganic layer IOL1 may be in contact with the second insulating layer 20. The organic layer OL may overlap the pixel circuit unit PC and the driving circuit unit GDC, and may have a flat top surface. An end of the organic layer OL may not be disposed outside the second dam DM2. The second inorganic layer IOL2 may overlap the first dam DM1 and the second dam DM2. An end of the second inorganic layer IOL2 may be in contact with the end of the first inorganic layer TOLL The first touch insulating layer TS-IL1 may overlap the first dam DM1 and the second dam DM2. An end of the first touch insulating layer TS-IL1 may be in contact with the second inorganic layer IOL2.

Each of the touch signal lines SL2 disposed on the first touch insulating layer TS-IL1 may overlap at least one of the shielding electrode SHL, the connection electrode E-CNT, and the second electrode CE. Each of the touch signal lines SL2 may overlap at least one of the shielding electrode SHL and the connection electrode E-CNT in the first non-display area NDA1. Each of the touch signal lines SL2 may overlap at least one of the connection electrode E-CNT and the second electrode CE in the second non-display area NDA2. Accordingly, the noise propagated from the driving circuit unit GDC toward the touch signal lines SL2 may be blocked by the shielding electrode SHL, the connection electrode E-CNT, and the second electrode CE, and the touch sensitivity of the touch sensing layer TS may be improved.

Figure 10:
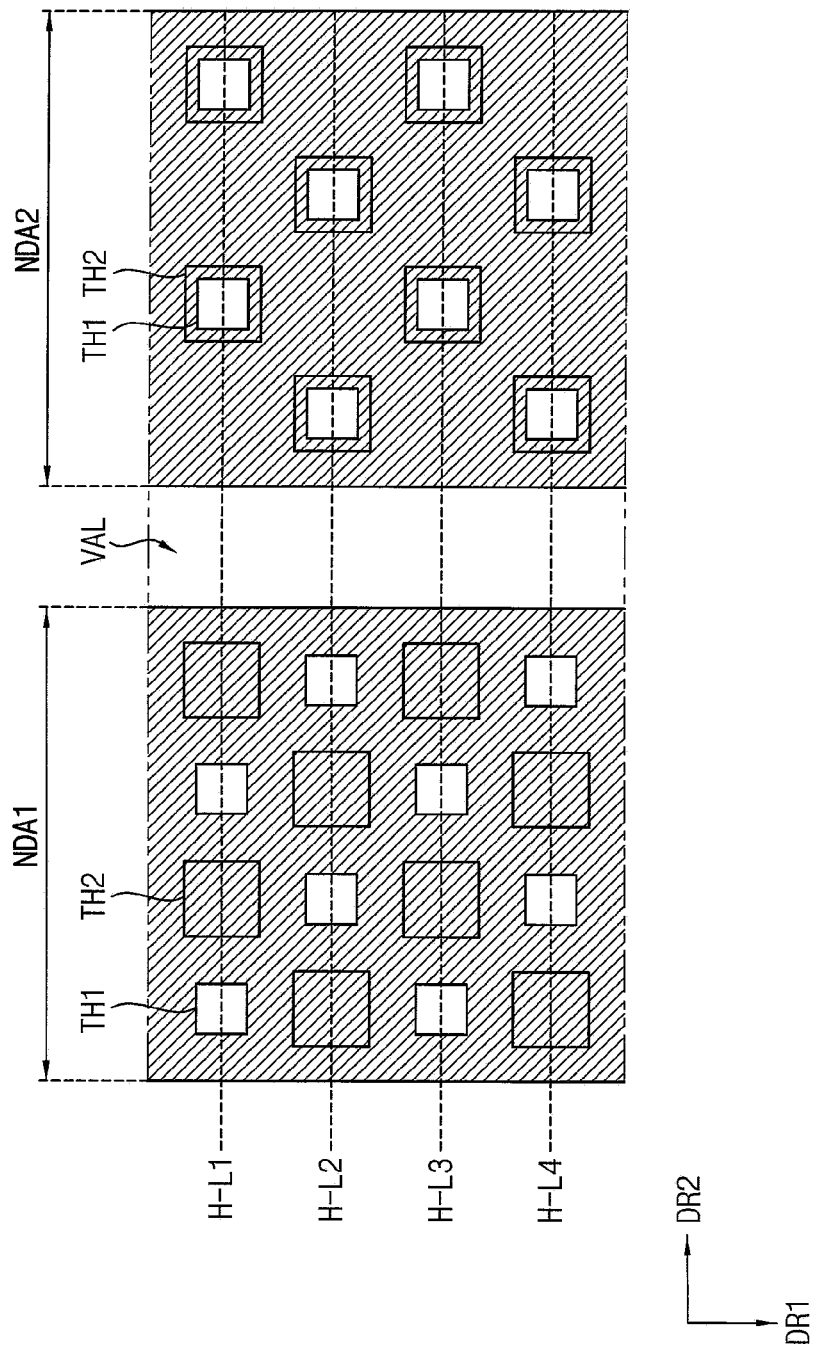
FIG. 10 is a plan view showing first through-holes TH1 of the shielding electrode SHL and the second through-holes TH2 of the connection electrode E-CNT of FIG. 9.

FIG. 10 is a plan view showing the first through-holes TH1 of the shielding electrode SHL and the second through-holes TH2 of the connection electrode E-CNT of FIG. 9.

Referring to FIG. 10, each of the first through-holes TH1 of the shielding electrode SHL and the second through-holes TH2 of the connection electrode E-CNT may have a polygonal shape, a circular shape, or the like when viewed in the plan view. FIG. 10 illustrates an embodiment where each of the first through-holes TH1 and the second through-holes TH2 has a rectangular shape, but the invention is not limited thereto.

A size of each of the first through-holes TH1 may be substantially the same as or different from a size of each of the second through-holes TH2. In an embodiment, as shown in FIG. 10, the size of each of the second through-holes TH2 is greater than the size of each of the first through-holes TH1, but the invention is not limited thereto. Alternatively, the size of each of the second through-holes TH2 may be smaller than or substantially the same as the size of each of the first through-holes TH1.

The first through-holes TH1 and the second through-holes TH2 may define a plurality of rows H-L1 to H-L4. The rows H-L1 to H-L4 may be arranged in the first direction DR1, and each of the rows H-L1 to H-L4 may extend in the second direction DR2.

The first through-holes TH1 and the second through-holes TH2 may be alternately arranged along the first direction DR1 and the second direction DR2 in the first non-display area NDA1 when viewed in the plan view. In one embodiment, for example, the first through-holes TH1 may be disposed in a first column of a first row H-L1 and a first column of a third row H-L3, respectively, and the second through-holes TH2 may be disposed in a first column of a second row H-L2 and a first column of a fourth row H-L4, respectively. In such an embodiment, the first through-holes TH1 may be disposed in the first column and the third column of the first row H-L1, respectively, and the second through-holes TH2 may be disposed in a second column and a fourth column of the first row H-L1, respectively.

First through-holes TH1 and second through-holes TH2 of odd rows H-L1 and H-L3 among a plurality of rows H-L1 to H-L4, and first through-holes TH1 and second through-holes TH2 of even rows H-L2 and H-L4 among the rows H-L1 to H-L4 may be alternately arranged with each other in the second direction DR2 in the second non-display area NDA2. In one embodiment, for example, when viewed in the first direction DR1, the first through-holes TH1 and the second through-holes TH2 of the odd rows H-L1 and H-L3, and may not overlap the first through-holes TH1 and the second through-holes TH2 of the even rows H-L2 and H-L4.

Figure 11:
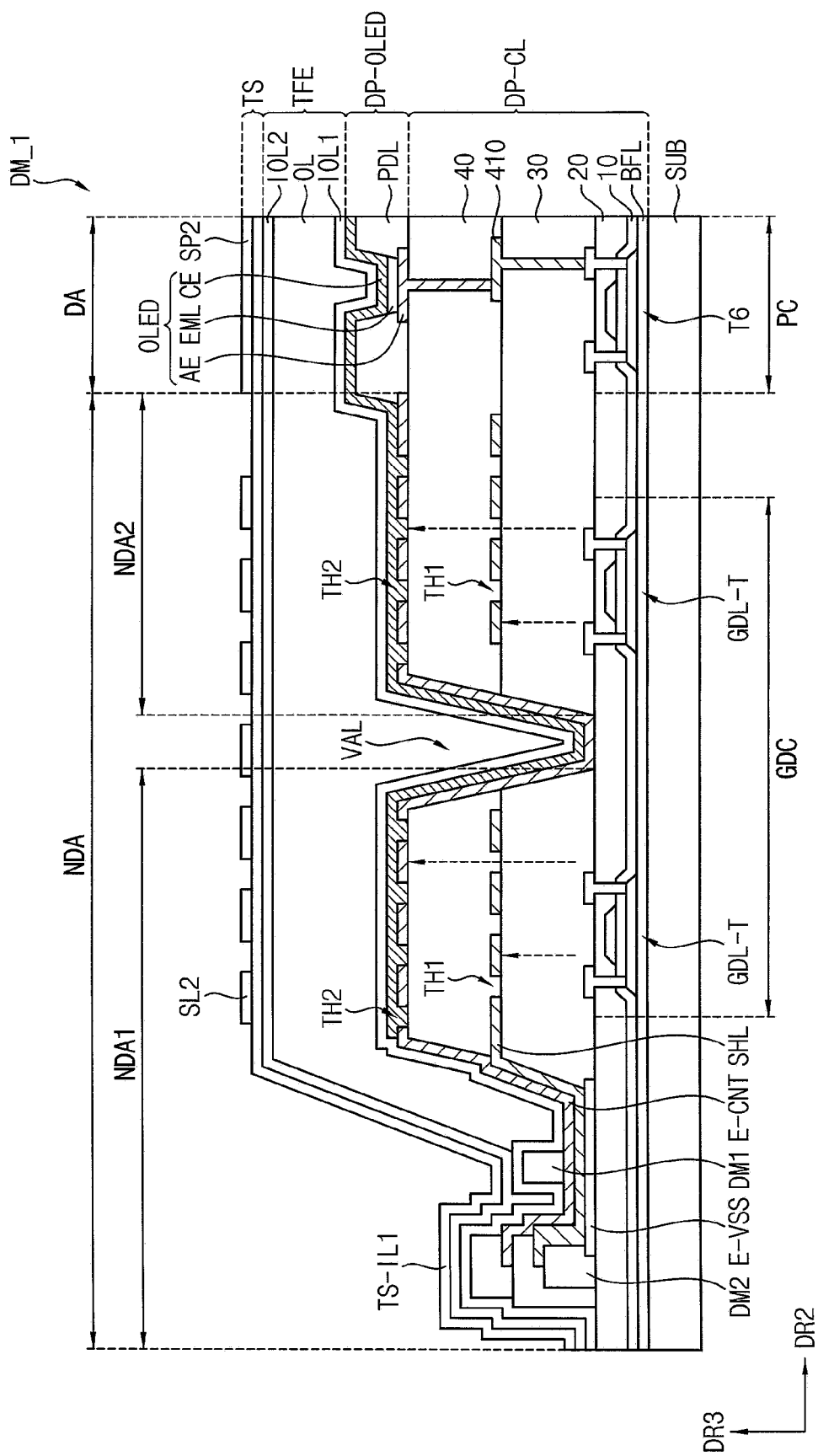
FIG. 11 is a cross-sectional view showing an alternative embodiment of the display module DM corresponding to the area AA of FIG. 3.

FIG. 11 is a cross-sectional view showing an alternative embodiment of the display module DM corresponding to the area AA of FIG. 3.

The display module DM_1 shown in FIG. 11 may be substantially the same as the display module DM described above with reference to FIG. 9 except for the second electrode CE. The same or like elements shown in FIG. 11 have been labeled with the same reference characters as used above to describe the embodiments of the display module DM shown in FIG. 9, and any repetitive detailed description thereof will hereinafter be omitted or simplified.

Referring to FIG. 11, in an embodiment, the second electrode CE may overlap the first non-display area NDA1 and the second non-display area NDA2. In such an embodiment, the second electrode CE may extend from the display area DA to the first non-display area NDA1 through the second non-display area NDA2. The second electrode CE may cover the second through-holes TH2 of the connection electrode E-CNT in the first non-display area NDA1 and the second non-display area NDA2.

In such an embodiment, the second electrode CE covers the second through-holes TH2 in the first non-display area NDA1, such that the noise propagated from the driving circuit unit GDC toward the touch sensing layer TS may be further blocked by the second electrode CE. Accordingly, the touch sensitivity of the touch sensing layer TS may be improved.

Figure 12:
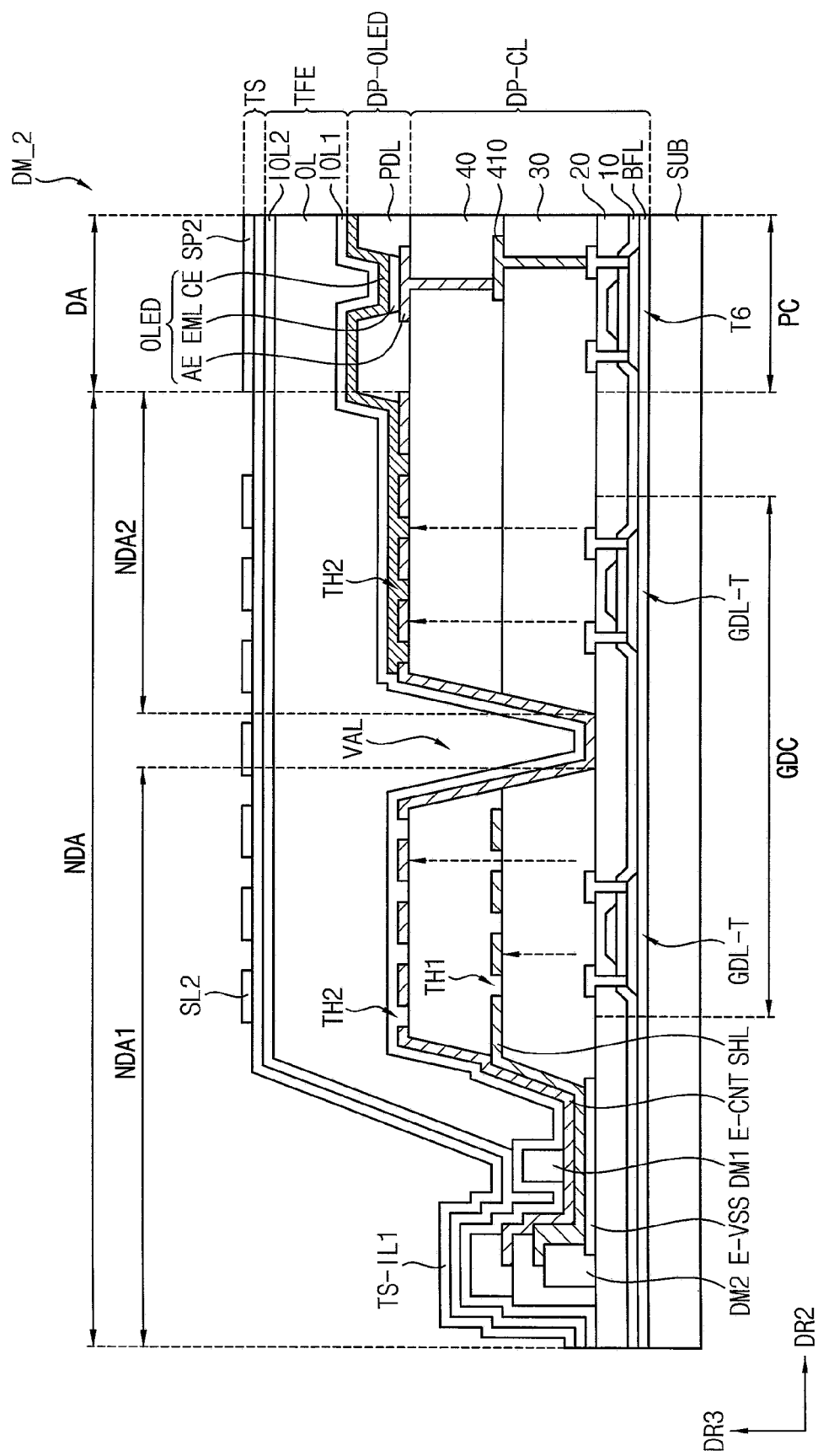
FIG. 12 is a cross-sectional view showing another alternative embodiment of the display module DM corresponding to the area AA of FIG. 3.
Figure 13:
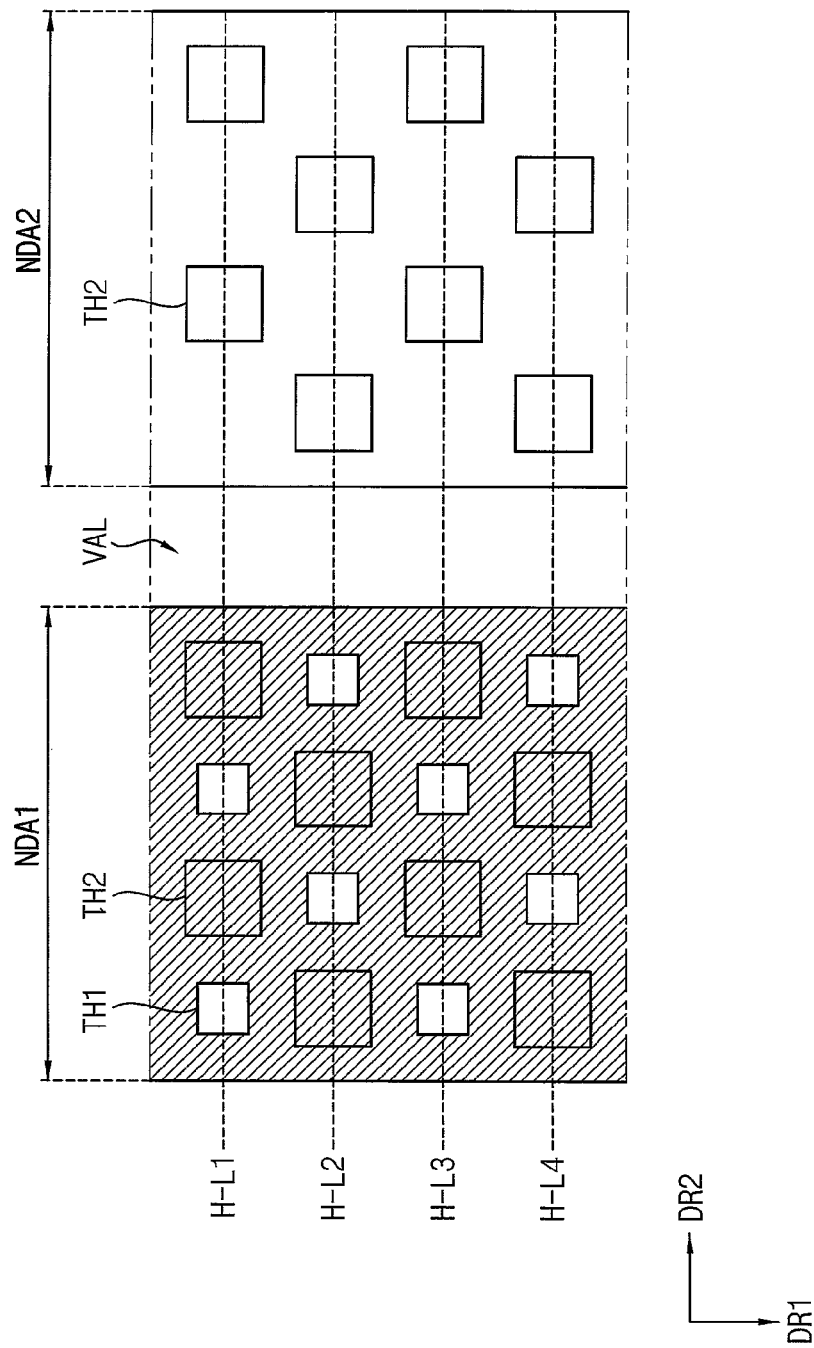
FIG. 13 is a plan view showing the first through-holes TH1 of the shielding electrode SHL and the second through-holes TH2 of the connection electrode E-CNT of FIG. 12.

FIG. 12 is a cross-sectional view showing another alternative embodiment of the display module DM corresponding to the area AA of FIG. 3. FIG. 13 is a plan view showing the first through-holes TH1 of the shielding electrode SHL and the second through-holes TH2 of the connection electrode E-CNT of FIG. 12.

The display module DM_2 shown in FIGS. 12 and 13 may be substantially the same as the display module DM described above with reference to FIGS. 9 and 10 except for the shielding electrode SHL. The same or like elements shown in FIGS. 12 and 13 have been labeled with the same reference characters as used above to describe the embodiments of the display module DM shown in FIGS. 9 and 10, and any repetitive detailed description thereof will hereinafter be omitted or simplified.

Referring to FIGS. 12 and 13, in an embodiment, the shielding electrode SHL may be connected to the power electrode E-VSS, and may partially overlap the driving circuit unit GDC. The shielding electrode SHL may overlap the first non-display area NDA1, and may not overlap the second non-display area NDA2. In such an embodiment, the shielding electrode SHL may not be disposed or formed in the second non-display area NDA2. Accordingly, the shielding electrode SHL may overlap the driving circuit unit GDC positioned in the first non-display area NDA1, and may not overlap the driving circuit unit GDC positioned in the second non-display area NDA2.

In such an embodiment, the second electrode CE may overlap the second non-display area NDA2, and may not overlap the first non-display area NDA1. Accordingly, the second electrode CE may not overlap the shielding electrode SHL. The second electrode CE may cover the second through-holes TH2 of the connection electrode E-CNT in the second non-display area NDA2.

In such an embodiment, although the shielding electrode SHL is not formed in the second non-display area NDA2, the second electrode CE covers the second through-holes TH2 in the second non-display area NDA2, such that the noise propagated from the driving circuit unit GDC toward the touch sensing layer TS may be blocked by the connection electrode E-CNT or the second electrode CE. Accordingly, the touch sensitivity of the touch sensing layer TS may be improved.

Figure 14:
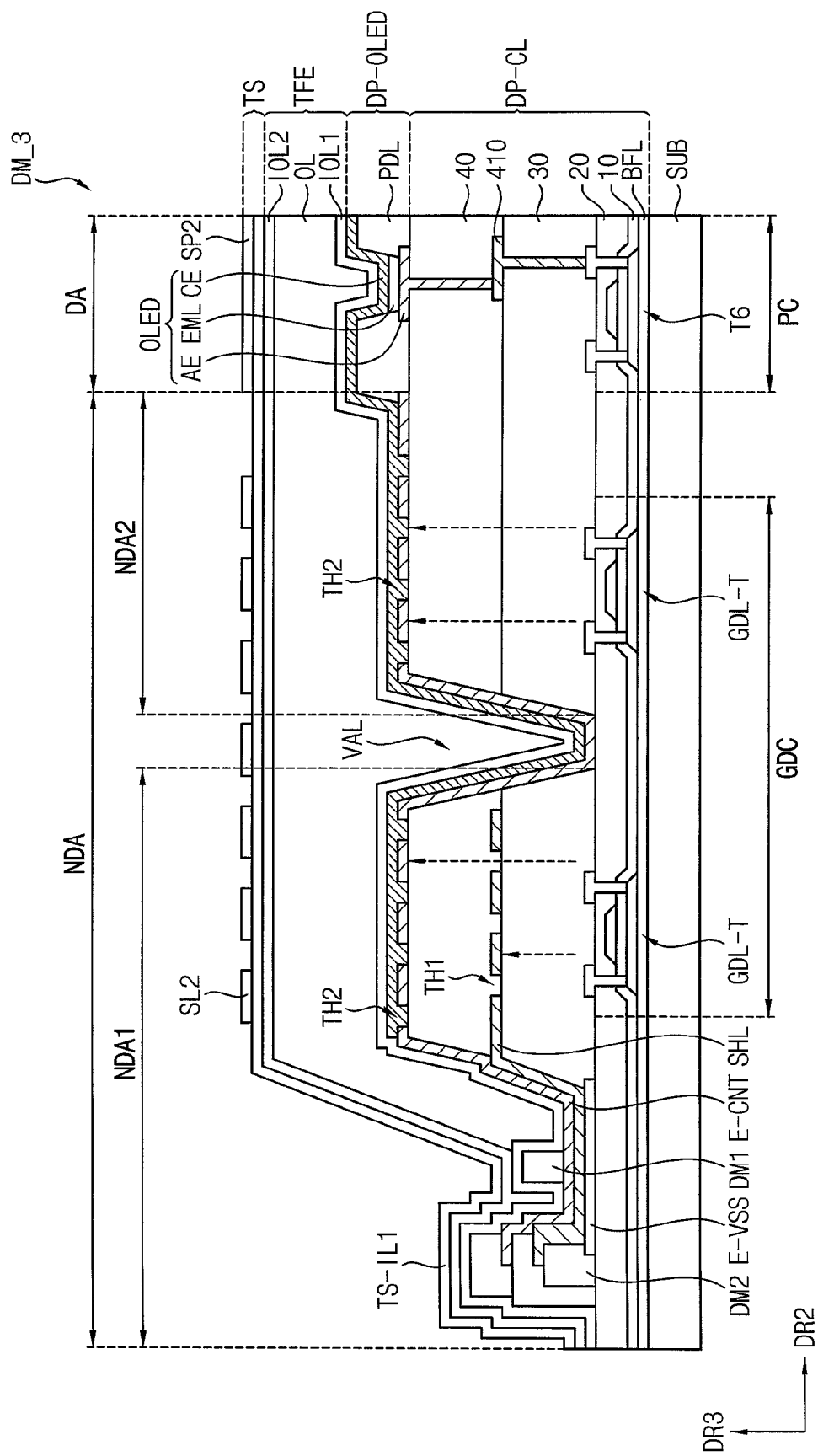
FIG. 14 is a cross-sectional view showing still another alternative embodiment of the display module DM corresponding to the area AA of FIG. 3.

FIG. 14 is a cross-sectional view showing still another alternative embodiment of the display module DM corresponding to the area AA of FIG. 3.

The display module DM_3 shown in FIG. 14 may be substantially the same as the display module DM_2 described above with reference to FIG. 12 except for the second electrode CE. The same or like elements shown in FIG. 14 have been labeled with the same reference characters as used above to describe the embodiments of the display module DM shown in FIGS. 9, 10 and 12, and any repetitive detailed description thereof will hereinafter be omitted or simplified.

Referring to FIG. 14, in an embodiment, the second electrode CE may overlap the first non-display area NDA1 and the second non-display area NDA2. In such an embodiment, the second electrode CE may extend from the display area DA to the first non-display area NDA1 through the second non-display area NDA2. Accordingly, the second electrode CE may partially overlap the shielding electrode SHL. The second electrode CE may cover the second through-holes TH2 of the connection electrode E-CNT in the first non-display area NDA1 and the second non-display area NDA2.

Embodiments of the display device described herein may be applied to a display device included in a computer, a laptop computer, a mobile phone, a smartphone, a smart pad, a portable media player ("PMP"), a personal digital assistant ("PDA"), an MP3 player, or the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device that includes a light emitting device including a first electrode, a light emitting layer and a second electrode, the display device comprising:
   a base layer including a display area, a first non-display area, and a second non-display area between the display area and the first non-display area;
   a circuit device layer disposed on the base layer, wherein the circuit device layer includes a driving circuit unit overlapping the first non-display area and the second non-display area, a power electrode disposed outside the driving circuit unit, and a shielding electrode connected to the power electrode and overlapping the driving circuit unit, wherein a plurality of first through-holes is defined through the shielding electrode;
   a light emitting device layer disposed on the circuit device layer, wherein the light emitting device layer includes the light emitting device overlapping the display area and a connection electrode electrically connecting the power electrode to the second electrode, wherein a plurality of second through-holes is defined through the connection electrode;
   a thin film encapsulation layer disposed on the light emitting device layer; and
   a touch sensing layer disposed on the thin film encapsulation layer, wherein the touch sensing layer includes a plurality of touch sensing electrodes, and a plurality of touch signal lines connected to the touch sensing electrodes and overlapping the connection electrode,
   wherein
   the first through-holes and the second through-holes do not overlap each other in the first non-display area, and
   the first through-holes and the second through-holes overlap each other in the second non-display area.

2. The display device of claim 1, wherein the second electrode covers the second through-holes in the second non-display area.

3. The display device of claim 2, wherein the second electrode overlaps the second non-display area and does not overlap the first non-display area.

4. The display device of claim 2, wherein the second electrode overlaps the first non-display area and the second non-display area.

5. The display device of claim 1, wherein each of the touch signal lines overlaps at least one selected from the shielding electrode and the connection electrode in the first non-display area.

6. The display device of claim 1, wherein each of the touch signal lines overlaps at least one selected from the connection electrode and the second electrode in the second non-display area.

7. The display device of claim 1, wherein the circuit device layer further includes:
   a first planarization layer disposed between the driving circuit unit and the shielding electrode; and
   a second planarization layer disposed between the shielding electrode and the connection electrode.

8. The display device of claim 7, wherein
   the first through-holes expose the first planarization layer, and
   the second through-holes expose the second planarization layer.

9. The display device of claim 7, wherein a valley positioned between the first non-display area and the second non-display area is defined in the first planarization layer and the second planarization layer.

10. The display device of claim 9, wherein the shielding electrode does not overlap the valley.

11. The display device of claim 9, wherein the second through-holes of the connection electrode do not overlap the valley.

12. The display device of claim 7, wherein the circuit device layer further includes:
   a pixel circuit unit disposed on the base layer and overlapping the display area; and
   a pixel connection electrode disposed between the first planarization layer and the second planarization layer, wherein the pixel connection electrode is electrically connected to the pixel circuit unit through a first contact hole defined through the first planarization layer, and electrically connected to the first electrode through a second contact hole defined through the second planarization layer.

13. The display device of claim 12, wherein
   the shielding electrode includes a same material as the pixel connection electrode, and the connection electrode includes a same material as the first electrode.

14. The display device of claim 1, wherein the first through-holes and the second through-holes are alternately arranged in a first direction in the first non-display area when viewed in a plan view.

15. The display device of claim 14, wherein the first through-holes and the second through-holes are alternately arranged in a second direction intersecting the first direction in the first non-display area when viewed in the plan view.

16. The display device of claim 1, wherein
the first through-holes and the second through-holes define a plurality of rows arranged in a first direction on a plane,
the first through-holes in odd rows among the rows and the first through-holes in even rows among the rows are alternately arranged with each other in a second direction intersecting the first direction in the second non-display area, and
the second through-holes in the odd rows among the rows and the second through-holes in the even rows among the rows are alternately arranged with each other in the second direction.

17. The display device of claim 1, wherein the thin film encapsulation layer includes:
a first inorganic layer disposed on the second electrode;
an organic layer disposed on the first inorganic layer and having a flat top surface; and
a second inorganic layer disposed on the organic layer and having an end in contact with the first inorganic layer.

18. A display device that includes a light emitting device including a first electrode, a light emitting layer and a second electrode, the display device comprising:
a base layer including a display area, a first non-display area, and a second non-display area between the display area and the first non-display area;
a circuit device layer disposed on the base layer, wherein the circuit device layer includes a driving circuit unit overlapping the first non-display area and the second non-display area, a power electrode disposed outside the driving circuit unit, and a shielding electrode connected to the power electrode, overlapping the first non-display area and not overlapping the second non-display area, wherein a plurality of first through-holes is defined through the shielding electrode;
a light emitting device layer disposed on the circuit device layer, wherein the light emitting device layer includes the light emitting device and a connection electrode electrically connecting the power electrode to the second electrode, wherein a plurality of second through-holes is defined through the connection electrode;
a thin film encapsulation layer disposed on the light emitting device layer; and
a touch sensing layer disposed on the thin film encapsulation layer, wherein the touch sensing layer includes a plurality of touch sensing electrodes and a plurality of touch signal lines connected to the touch sensing electrodes and overlapping the connection electrode,
wherein
the first through-holes and the second through-holes do not overlap each other in the first non-display area, and
the second electrode covers the second through-holes in the second non-display area.

19. The display device of claim 18, wherein the second electrode does not overlap the shielding electrode.

20. The display device of claim 18, wherein the second electrode partially overlaps the shielding electrode.

* * * * *